(12) United States Patent
Tomura et al.

(10) Patent No.: US 8,110,933 B2
(45) Date of Patent: Feb. 7, 2012

(54) SEMICONDUCTOR DEVICE MOUNTED STRUCTURE AND SEMICONDUCTOR DEVICE MOUNTED METHOD

(75) Inventors: Yoshihiro Tomura, Osaka (JP); Daido Komyoji, Nara (JP)

(73) Assignee: Panasonic Corporation, Osaka (JP)

( * ) Notice: Subject to any disclaimer, the term of this patent is extended or adjusted under 35 U.S.C. 154(b) by 125 days.

(21) Appl. No.: 12/521,020

(22) PCT Filed: Dec. 25, 2007

(86) PCT No.: PCT/JP2007/074844
§ 371 (c)(1),
(2), (4) Date: Jun. 24, 2009

(87) PCT Pub. No.: WO2008/078746
PCT Pub. Date: Jul. 3, 2008

(65) Prior Publication Data
US 2010/0025847 A1 Feb. 4, 2010

(30) Foreign Application Priority Data
Dec. 26, 2006 (JP) .................. 2006-349511

(51) Int. Cl.
*H01L 21/00* (2006.01)
*H01L 29/40* (2006.01)
*H01L 23/29* (2006.01)
(52) U.S. Cl. ......... 257/787; 257/778; 438/106; 438/108
(58) Field of Classification Search .................. 438/106, 438/108; 257/778, 787
See application file for complete search history.

(56) References Cited

U.S. PATENT DOCUMENTS

| 5,629,566 A | 5/1997 | Doi et al. |
| 6,208,525 B1 * | 3/2001 | Imasu et al. .................. 361/783 |
| 6,288,451 B1 | 9/2001 | Tsao |
| 6,391,683 B1 | 5/2002 | Chiu et al. |
| 6,853,089 B2 * | 2/2005 | Ujiie et al. .................... 257/783 |
| 2004/0212097 A1 | 10/2004 | Chen et al. |
| 2005/0090066 A1 | 4/2005 | Zhu et al. |

(Continued)

FOREIGN PATENT DOCUMENTS
CN 1624885 6/2005
(Continued)

OTHER PUBLICATIONS

International Preliminary Report on Patentability and Written Opinion of the International Searching Authority issued Jul. 9, 2009 in corresponding International (PCT) Application No. PCT/JP2007/074844 (with English translation).

(Continued)

*Primary Examiner* — James Mitchell
(74) *Attorney, Agent, or Firm* — Wenderoth, Lind & Ponack, L.L.P.

(57) ABSTRACT

A recess portion is formed on a board surface at a position facing a peripheral end portion of a semiconductor device so as to place a sealing-bonding resin partially inside the recess portion. Thereby, increases of a placement area for a fillet portion (foot spreading portion) of the sealing-bonding resin are suppressed while its inclination angle is increased. Thus, stress loads that occur to peripheral portions of the semiconductor device due to thermal expansion differences and thermal contraction differences among individual members caused by heating and cooling processes during a mounting operation are relaxed, by which internal breakdown of the semiconductor device mounted structure is avoided.

7 Claims, 20 Drawing Sheets

U.S. PATENT DOCUMENTS

| | | | |
|---|---|---|---|
| 2006/0046347 A1* | 3/2006 | Wood et al. | 438/106 |
| 2006/0163749 A1 | 7/2006 | Lee et al. | |
| 2006/0220230 A1* | 10/2006 | Tanaka et al. | 257/723 |

FOREIGN PATENT DOCUMENTS

| | | | |
|---|---|---|---|
| JP | 4-51144 | | 4/1992 |
| JP | 8-055938 | | 2/1996 |
| JP | 10-154859 | * | 6/1998 |
| JP | 2000-188362 | | 7/2000 |
| JP | 2001-035886 | | 2/2001 |
| JP | 2002-134558 | | 5/2002 |
| JP | 2003-347460 | | 12/2003 |
| JP | 2004-214344 | | 7/2004 |
| JP | 2004-266016 | | 9/2004 |
| JP | 2004-289083 | | 10/2004 |
| JP | 2004-349399 | | 12/2004 |
| JP | 2007-173361 | | 7/2007 |
| JP | 2007-189005 | | 7/2007 |

OTHER PUBLICATIONS

International Search Report issued Feb. 12, 2008 in the International (PCT) Application of which the present application is the U.S. National Stage.

English translation of Office Action issued Nov. 24, 2010 in a counterpart Chinese application.

\* cited by examiner

Fig. 15 - PRIOR ART
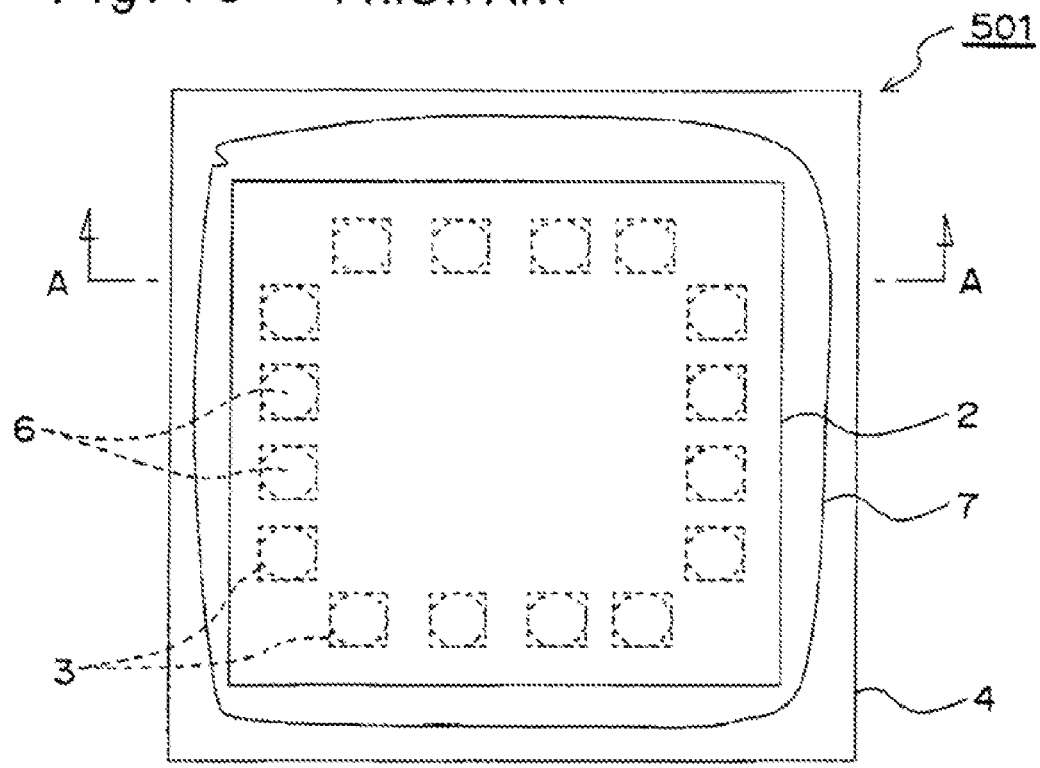
Fig. 16 - PRIOR ART
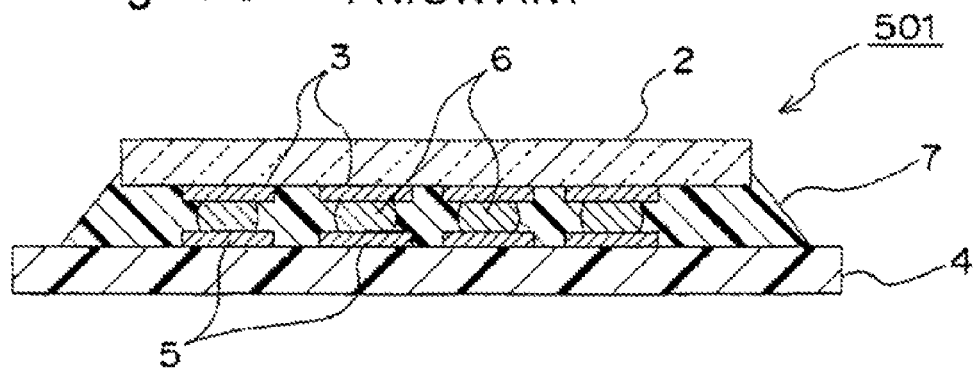

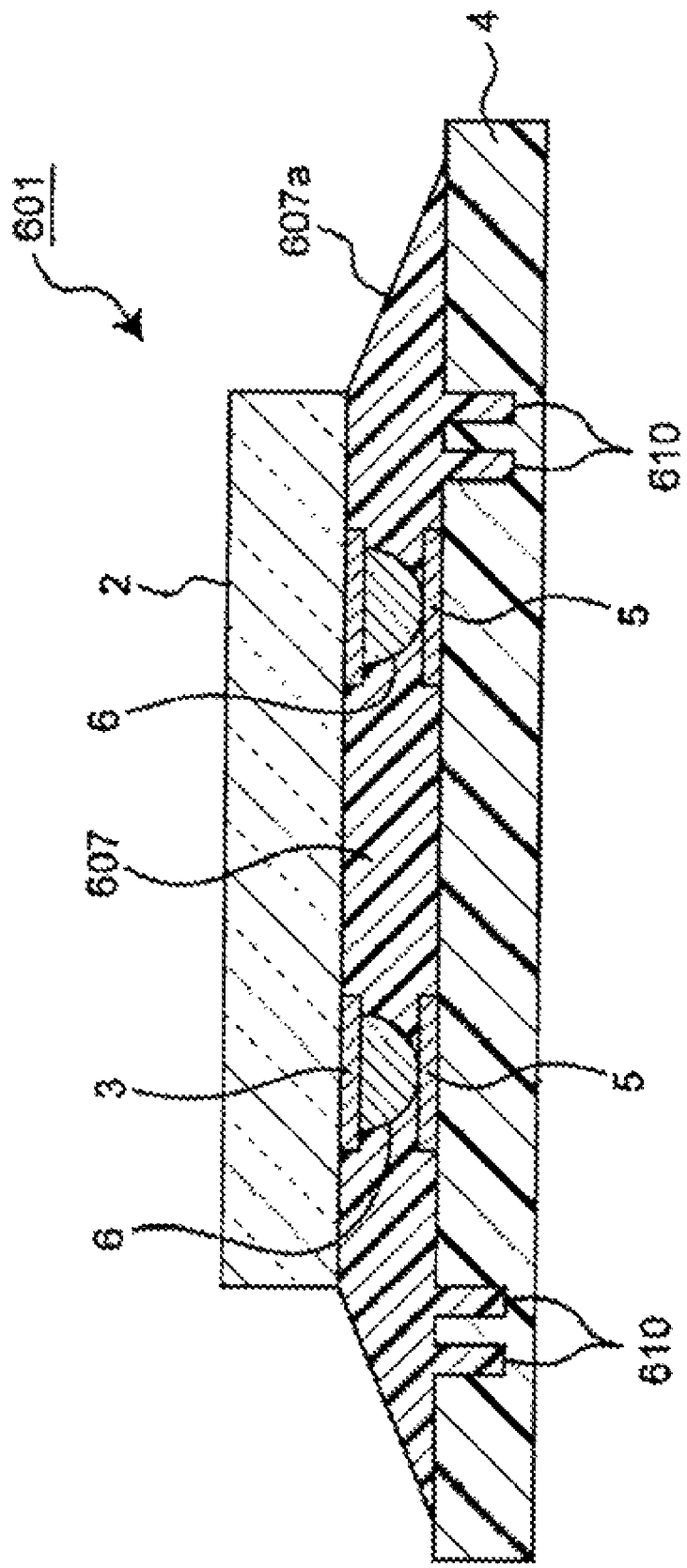
Fig. 17 - PRIOR ART

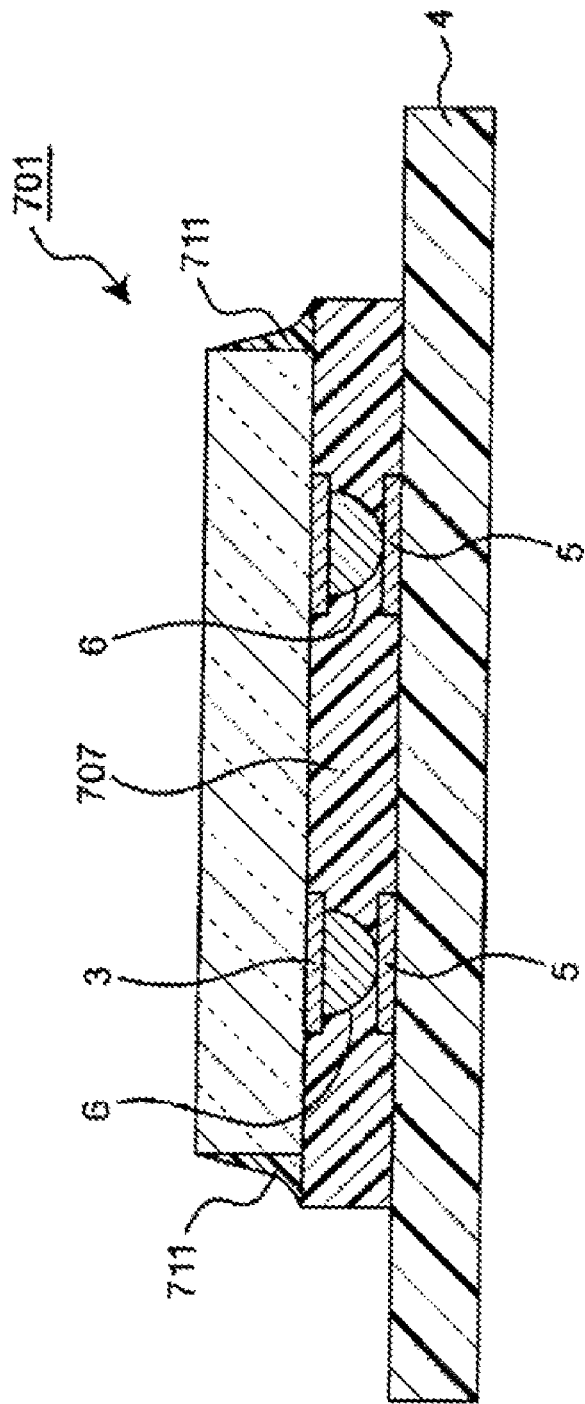
Fig. 18 - PRIOR ART

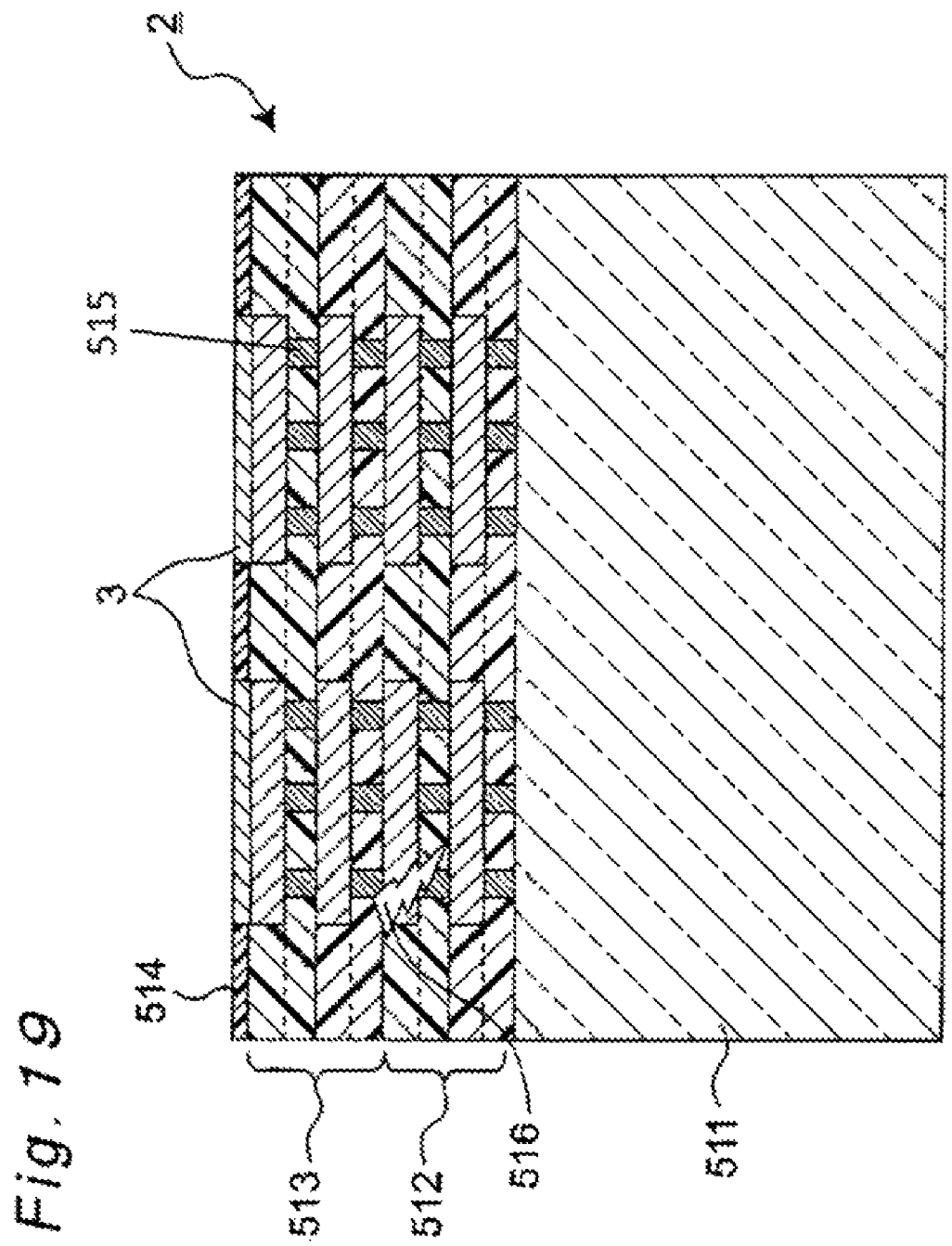

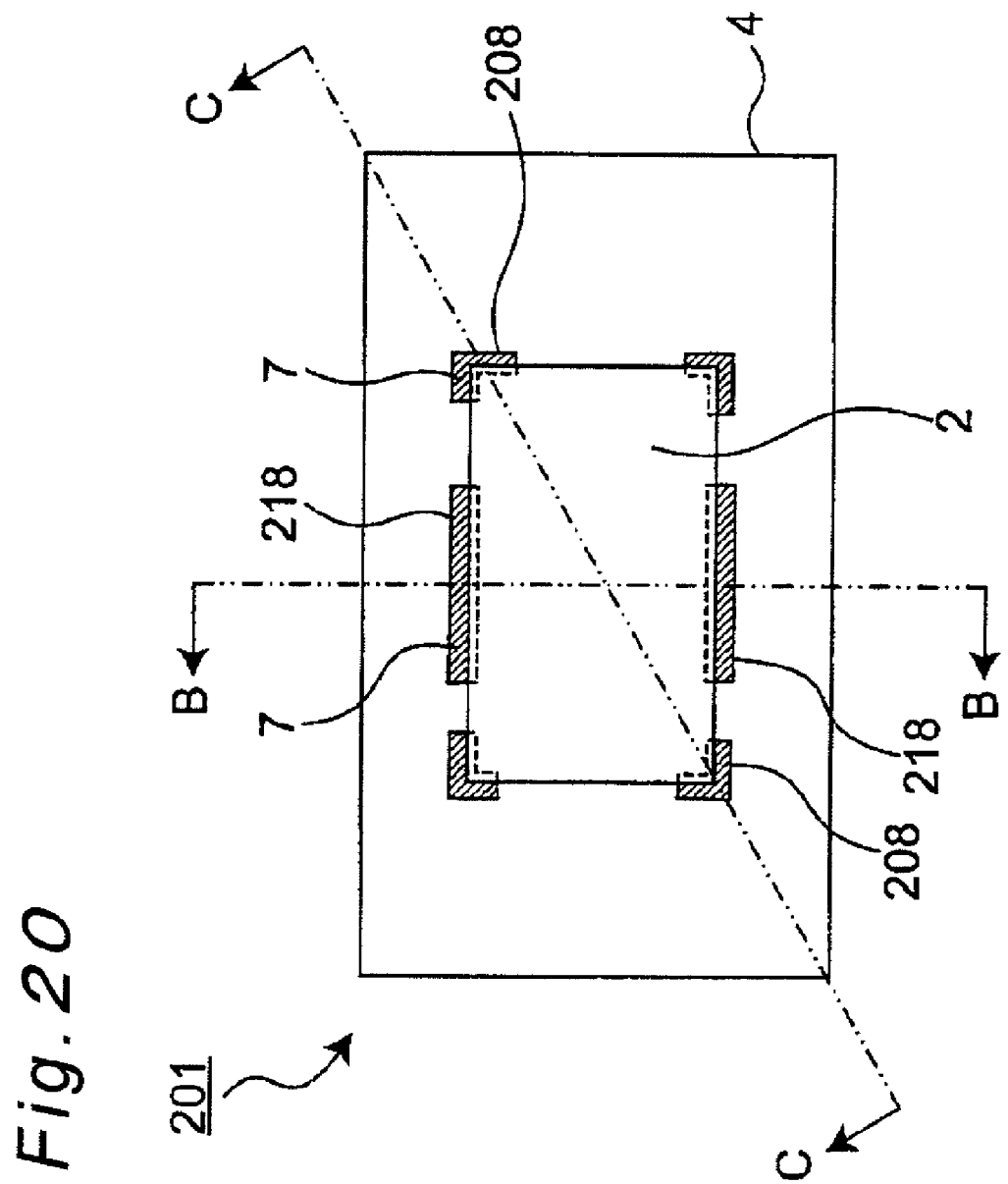

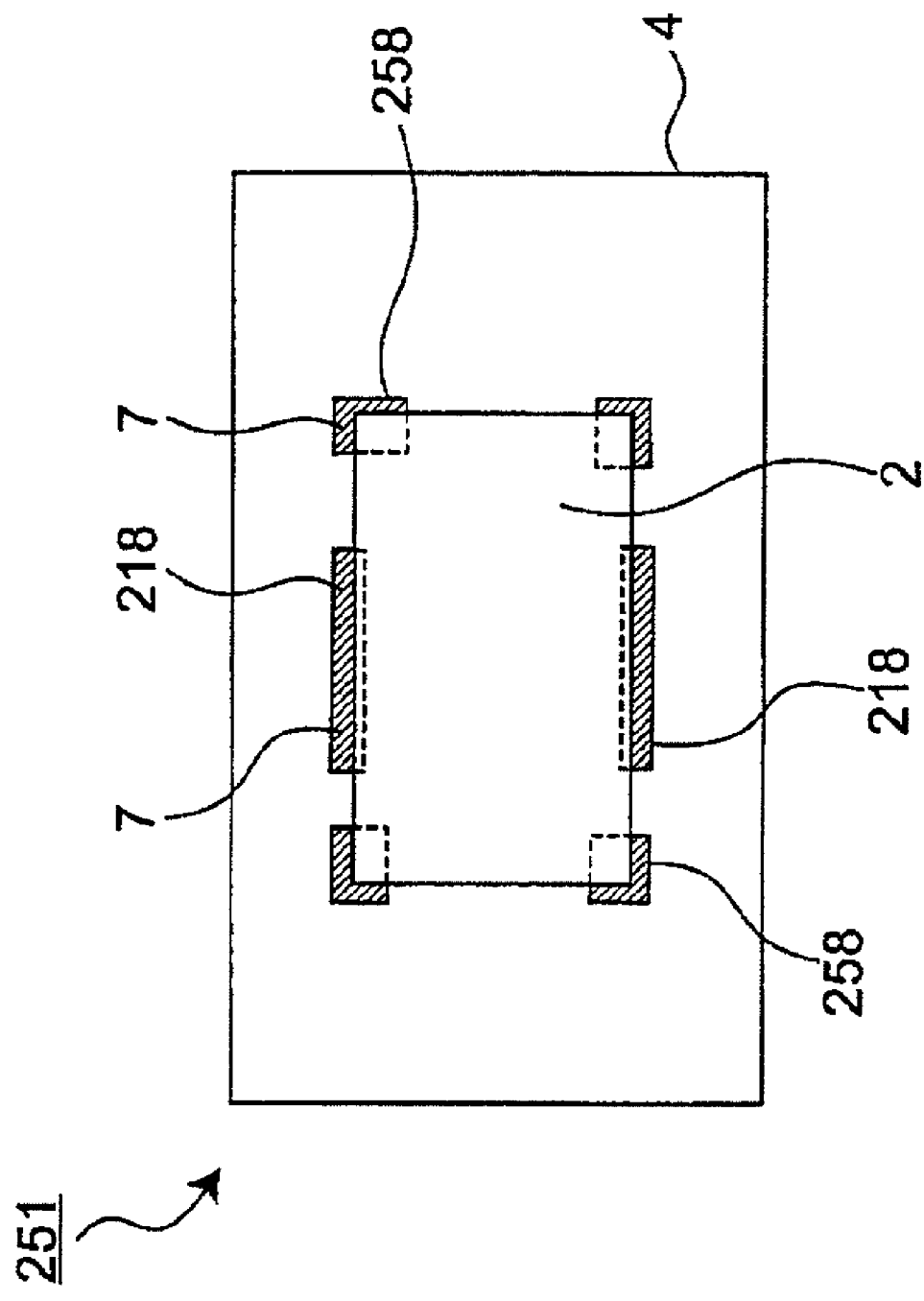

SEMICONDUCTOR DEVICE MOUNTED STRUCTURE AND SEMICONDUCTOR DEVICE MOUNTED METHOD

BACKGROUND OF THE INVENTION

1. Technical Field

The present invention relates to a semiconductor device mounted structure, as well as a semiconductor device mounting method, in which device electrodes of a semiconductor device and board electrodes of a board are connected to each other via bump electrodes, respectively, and in which a sealing-bonding resin is placed between the semiconductor device and the board, so that the semiconductor device is mounted on the board.

2. Background Art

For electronic components, bare chip mounting that allows the mounting area to be remarkably reduced in comparison to conventional semiconductor packages has been in use. Under this condition, face-down mounting is widely used in which a circuit formation surface of a semiconductor chip (semiconductor device) and a circuit formation surface of a board are placed face to face and laid on each other via bumps (bump electrodes) formed of gold or other metal so as to obtain conduction. The face-down mounting allows a semiconductor chip as well as its whole mounted structure to be further downsized, compared with face-up mounting in which a circuit formation surface of a board and a surface of a semiconductor chip facing its circuit formation surface are placed face to face and, in this state, metal thin wires are led out by wire bonding so that both-side terminals are connected to each other.

FIG. 15 shows a schematic plan view of a conventional semiconductor chip mounted structure 501 as mentioned above. FIG. 16 shows a sectional view of the mounted structure 501 taken along the line A-A of FIG. 15. As shown in FIGS. 15 and 16, pads 3, which are a plurality of device electrodes, are formed on a circuit formation surface, i.e. lower-side surface, of a generally rectangular-shaped semiconductor chip 2, while a plurality of board electrodes 5 are formed on a circuit formation surface, i.e. upper-side surface, of a board 4. These pads 3 and board electrodes 5 are electrically connected to each other, respectively and individually, via bumps 6 that are bump electrodes individually formed on the pads 3. Also, between the semiconductor chip 2 and the board 4, an underfill resin 7 is filled and placed as a sealing-bonding insulative resin. Thus, with the pads 3, the board electrodes 5 and the bumps 6 sealed respectively, a mounted structure in which the semiconductor chip 2 and the board 4 are bonded together is made up.

Such a mounted structure is formed, for example, by executing a so-called sheet method in which the bumps 6 formed on the individual pads 3 of the semiconductor chip 2 and the board 4 having a sheet-like underfill resin 7 attached on its surface are set face to face and thereafter the semiconductor chip 2 is pressed against the board 4 via the underfill resin 7. The conventional sheet method like this, in particular, makes it possible to simultaneously carry out the filling and placement of the underfill resin 7 to between the semiconductor chip 2 and the board 4 as well as the electrical connection between the pads 3 of the semiconductor chip 2 and the board electrodes 5 of the board 4 via the bumps 6. Thus, the method is recognized as effective in terms of process simplification and time saving and has been widely used.

Patent Literature 1: JP 2000-188362 A
Patent Literature 2: JP 2002-134558 A

SUMMARY OF THE INVENTION

In recent years, advancements have been being made toward lower dielectric constants of insulating material inside the chip with a view to scale-down of chip-inside interconnections for size and cost reductions of semiconductor packages. With regard to such low-dielectric-constant resin materials (hereinafter, referred to as "low-k materials"), as the dielectric constant decreases, the resin material becomes more fragile in terms of mechanical strength, posing a fear for internal breakdown of semiconductor chips caused by the fragility of low-k materials in semiconductor chip mounting process.

Here is given a description of low-k materials with reference to a schematic sectional view of a semiconductor chip shown in FIG. 19. As shown in FIG. 19, the semiconductor chip 2 includes a silicon (Si) layer 511, a low-k layer 512 formed from a low-k material on the silicon layer 511, an interconnect layer 513 formed on the low-k layer 512 primarily for formation of interconnections, and an insulating layer 514 formed from $SiO_2$ or $SiN_x$ on the interconnect layer 513. It is to be noted that the low-k layer 512 and the interconnect layer 513 are formed by, for example, stacking of a plurality of thin-film layers. Also, on a surface of the insulating layer 514, a plurality of pads 3 are placed so as to be exposed, and a plurality of via electrodes 515 for electrically connecting each of the pads 3 and the silicon layer 511 to each other are formed to extend through the low-k layer 512 and the interconnect layer 513. The low-k layer 512 like this, which is formed as a thin film thinner than the silicon layer 511 that is a main part of the semiconductor chip 2, has a characteristic of being more fragile in mechanical strength than the other layers with lowering dielectric constant as described above. Due to such fragility in mechanical strength of the low-k layer 512, there is a fear for internal breakdown of the semiconductor chip due to, for example, occurrence of a crack 516 in the low-k layer 512, occurrence of interface peeling in the low-k layer 512 and the like.

In general, the coefficient of thermal expansion of a semiconductor chip is extremely smaller than those of the underfill and the board. Therefore, thermal expansion differences or thermal contraction differences among the individual members caused by heating and cooling processes during a mounting operation cause large tensile loads to be generated at portions of the semiconductor chip, particularly corner portions of a rectangular-shaped semiconductor chip. As an example, if the coefficient of thermal expansion of the semiconductor chip is 1, then the coefficient of thermal expansion of the underfill is 40-50 ppm and the coefficient of thermal expansion of the board is 5-20 ppm. Further, in a semiconductor chip mounting process, the board is flexed by mechanical loads caused in execution of a board cutting-and-dividing process subsequent to semiconductor chip mounting on the board, i.e. a multiple board cutting-and-dividing process, or a solder ball applying process for the board bottom face and the like, with the result that the semiconductor chip is burdened with even larger loads.

In order to reduce these and other loads, for example, Patent Literature 1 adopts a configuration that in a semiconductor device mounted structure 601, as shown in a schematic explanatory view of FIG. 17, recess portions 610 are formed in a surface of the board 4 positioned under fillet portions (foot spreading portions) 607a of the filler (underfill) 607 formed at peripheries of the semiconductor chip 2, where the filler 607 is filled up into the recess portions 610, i.e., the recess portions 610 are filled with the filler. In such a case, the filler 607 filled into the recess portions 610 acts as an anchor to enhance the bond strength between the filler 607 and the board 4. That is, the configuration adopted is such that peripheral end portions of the semiconductor device are firmly held to the board 4 via the filler.

Also, for example, Patent Literature 2 adopts a configuration that in a semiconductor device mounted structure 701, as shown in FIG. 18, a reinforcing member (resin) 711 is provided between side faces of corner portions of the semiconductor device 2 and an underfill 707 so that stress caused to act thereon is dispersed by the reinforcing member 711.

However, in the semiconductor device mounted structure 601 of Patent Literature 1, which adopts the configuration that the filler 607 is securely filled into the recess portions 610 formed around the mounting area for the semiconductor device 2 to enhance the bond strength between the filler 607 and the board 4, the amount of the filler 607 placed at the fillet portions 607a increases so that the spreading area of the fillet portions 607a tends to be extended. Therefore, it becomes harder to achieve a sufficient reduction of tensile loads due to thermal expansion differences or thermal contraction differences among the individual members and, particularly in cases of thin type semiconductor devices, stress loads (tensile loads) are additionally involved so that device breakdown due to peeling can occur in some cases. In this connection, the term 'peeling' refers to a phenomenon that portions of the semiconductor device in contact with the underfill (resin or filler) are separated off from the semiconductor device body.

Further, the semiconductor device mounted structure 701 of Patent Literature 2, which uses two types of resins for stress relaxation, requires a more complex manufacturing process. Further, when the semiconductor device 2 is a thin type one, placing the reinforcing member 711 is difficult to do as a further issue.

Accordingly, an object of the present invention, lying in solving the above-described issues, is to provide a semiconductor device mounted structure, as well as a semiconductor device mounting method, in which device electrodes of a semiconductor device and board electrodes of a board are connected to each other via bump electrodes, respectively, and in which a sealing-bonding resin is placed between the semiconductor device and the board so that the semiconductor device is mounted on the board, the device and the method being capable of reducing loads generated at peripheral portions of the semiconductor device due to board flexures for thermal expansion differences and thermal contraction differences among the individual members caused by heating process and cooling process in mounting operation as well as for mechanical loads after the mounting operation so that internal breakdown of the semiconductor device mounted structure can be avoided.

In order to achieve the above object, the present invention has the following constitutions.

According to a first aspect of the present invention, there is provided a semiconductor device mounted structure comprising:

a semiconductor device having a plurality of device electrodes;

a board having a plurality of board electrodes;

a plurality of bump, electrodes for connecting the device electrodes and the board electrodes to each other, respectively;

a sealing-bonding resin which seals the device electrodes, the board electrodes and the bump electrodes, respectively, and which is placed between the semiconductor device and the board so as to make the semiconductor device and the board bonded to each other; and a recess portion which is formed in an electrode formation surface of the board at a position facing a peripheral end portion of the semiconductor device, and in which the sealing-bonding resin is placed partially inside thereof.

According to a second aspect of the present invention, there is provided the semiconductor device mounted structure as defined in the first aspect, wherein the recess portion formed in the board is a resin-spreading-area restricting recess portion in which the resin is placed inside thereof so as to restrict a spreading area of the resin that goes spreading out of a semiconductor-device opposing region of the board.

According to a third aspect of the present invention, there is provided the semiconductor device mounted structure as defined in the first aspect, wherein the recess portion is formed so as to include a region more inward than a peripheral end portion of the semiconductor-device opposing region of the board.

According to a fourth aspect of the present invention, there is provided the semiconductor device mounted structure as defined in the first aspect, wherein the recess portion has an inner bottom portion which is inclined so as to increasingly deepen, toward a periphery of the semiconductor-device opposing region of the board.

According to a fifth aspect of the present invention, there is provided the semiconductor device mounted structure as defined in the first aspect, wherein a swelling portion swollen to be higher an opening end portion of the recess portion is formed at a center of the semiconductor-device opposing region of the board, and a downward gradient is provided over a range from the swelling portion to an inner bottom portion of the recess portion.

According to a sixth aspect of the present invention, there is provided the semiconductor device mounted structure as defined in any one of the first through fifth aspects, wherein the recess portion formed at a position facing a corner portion of the semiconductor device having a generally rectangular shape is so formed as to be smaller in internal capacity than the recess portion formed at any other position.

According to a seventh aspect of the present invention, there is provided the semiconductor device mounted structure as defined in any one of the first through fifth aspects, wherein a plurality of the recess portions are formed in a peripheral end portion, of the semiconductor-device opposing region of the board.

According to an eighth aspect of the present invention, there is provided the semiconductor device mounted structure as defined in any one of the first through fifth aspects, wherein the recess portion is formed so as to be continuous over an entire periphery of the peripheral end portion of the semiconductor-device opposing region of the board.

According to a ninth aspect of the present invention, there is provided the semiconductor device mounted structure as defined in any one of the first through fifth aspects, wherein the recess portion formed at a position facing a corner portion of the semiconductor device having a generally rectangular shape is so formed as to have an inner bottom portion deeper than the recess portion formed at any other position.

According to a tenth aspect of the present invention, there is provided the semiconductor device mounted structure as defined in the fourth aspect, wherein the recess portion formed at a position facing a corner portion of the semiconductor device having a generally rectangular shape is so formed as to have the inner bottom portion having an inclination angle larger than an inclination angle of the inner bottom portion of the recess portion formed at any other position.

According to an eleventh aspect of the present invention, there is provided a semiconductor device mounting method comprising:

placing a sealing-bonding resin on a mounting area in a board in which a recess portion is formed at a peripheral end portion of the mounting area for a semiconductor device;

pressing the semiconductor device against the board via the sealing-bonding resin so that device electrodes of the semiconductor device and board electrodes of the board are connected to each other via bump electrodes, respectively, and moreover that part of the sealing-bonding resin that spreads out of the mounting area is led into the recess portion so that the device electrodes, the board electrodes and the bump electrodes, respectively, are sealed by the resin while a spreading area of the resin is being restricted;

thereafter, heating and curing the sealing-bonding resin, thereby mounting the semiconductor device onto the board.

According to a twelfth aspect of the present invention, there is provided the semiconductor device mounting method as defined in the eleventh aspect, wherein the sealing by the sealing-bonding resin is fulfilled, with use of a pressure bonding tool having a presser portion formed from an elastic material, by pressing the semiconductor device against the board via the sealing-bonding resin with the presser portion, and moreover pressing the sealing-bonding resin spreading out of the mounting area with the presser portion to lead the sealing-bonding resin into the recess portion while the resin spreading area is being restricted.

According to the present invention, in a semiconductor device mounted structure, since a recess portion having a sealing-bonding resin placed partially inside thereof is formed on a board surface at a position facing a peripheral end portion of a semiconductor device, increases of a placement area for a fillet portion (foot spreading portion) of the sealing-bonding resin are suppressed while its inclination angle can be enlarged. That is, whereas a fillet portion is formed by the resin that spreads outward of the periphery of a mutual opposing region of the board and the semiconductor device by a pressing force applied during mounting of the semiconductor device on the board via the resin, part of the resin is led into the recess portion during this process, by which the resin spreading area can be decreased while the inclination angle of the fillet portion can be enlarged. By decreasing the area of the spreading area of the fillet portion in this way to enlarge its inclination angle, it becomes achievable to relax loads that occur to peripheral portions of the semiconductor device due to thermal expansion differences and thermal contraction differences among the individual members caused by heating process and cooling process in mounting operation as well as due to flexures of the board relative to mechanical loads after the mounting operation, so that internal breakdown of the semiconductor device mounted structure can be avoided.

BRIEF DESCRIPTION OF THE DRAWINGS

These aspects and features of the present invention will become clear from the following description taken in conjunction with the preferred embodiments thereof with reference to the accompanying drawings, in which:

FIG. 15 is a schematic plan view of a semiconductor chip mounted structure according to a prior art;

FIG. 16 is a schematic sectional view of the semiconductor chip mounted structure of FIG. 15 taken along the line A-A;

FIG. 17 is a schematic sectional view of another semiconductor chip mounted structure according to the prior art;

FIG. 18 is a schematic sectional view of still another semiconductor chip mounted structure according to the prior art;

FIG. 19 is a schematic sectional view of a conventional semiconductor chip;

FIG. 20 is a schematic plan view of a semiconductor chip mounted structure according to a fifth embodiment of the invention;

FIG. 23 is a schematic plan view of a semiconductor chip mounted structure according to a modification of the fifth embodiment.

DETAILED DESCRIPTION OF THE INVENTION

Figure 1:
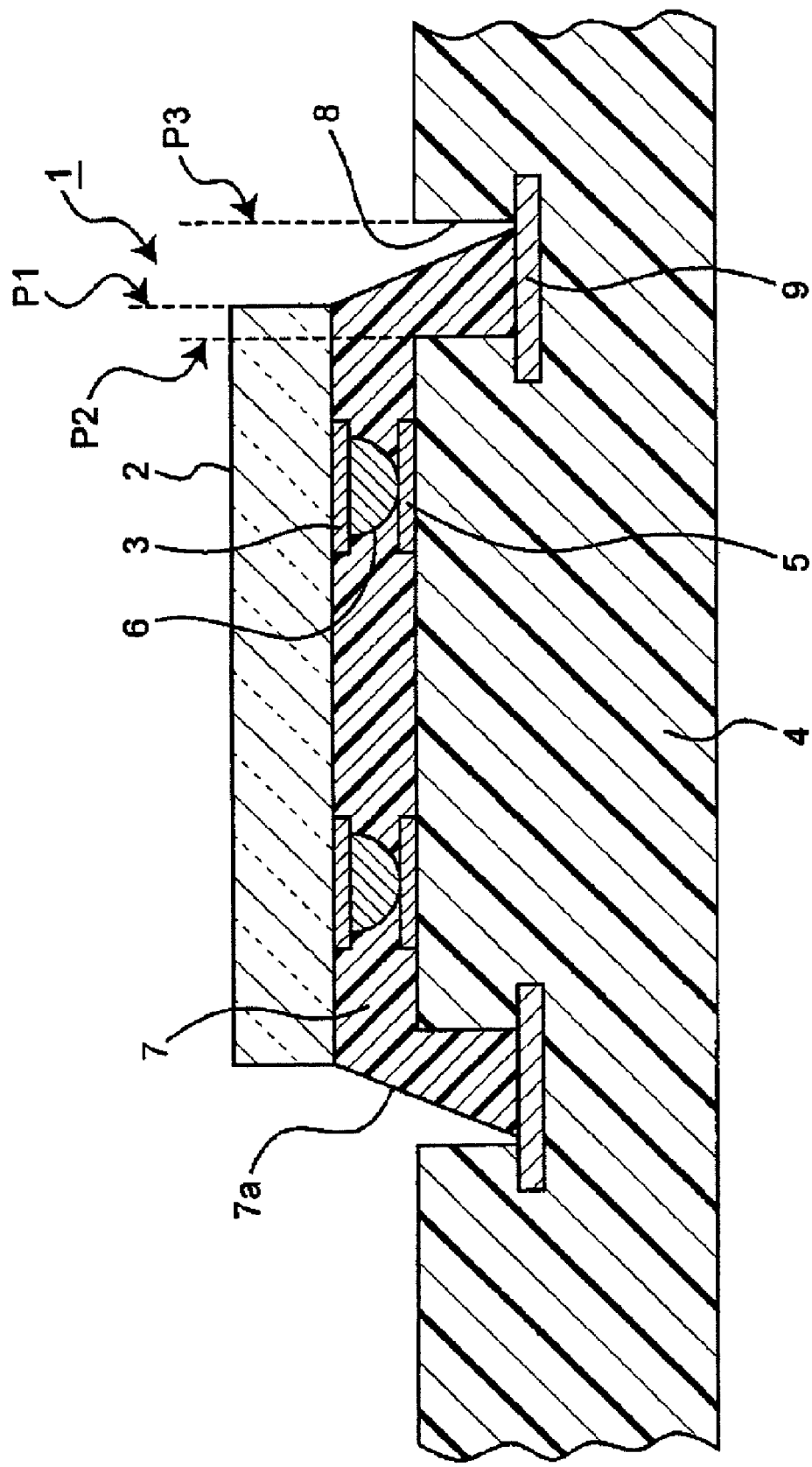
FIG. 1 is a schematic sectional view of a semiconductor chip mounted structure according to a first embodiment of the invention.

Before the description of the present invention proceeds, it is to be noted that like parts are designated by like reference numerals throughout the accompanying drawings.

Hereinbelow, embodiments according to the present invention will be described in detail with reference to the accompanying drawings.

First Embodiment

FIG. 1 shows a schematic sectional view of a semiconductor chip mounted structure 1 which is an example of a semiconductor device mounted structure according to a first embodiment of the invention.

As shown in FIG. 1, in the semiconductor chip mounted structure 1 of the first embodiment, a sheet-like underfill 7, which is an example of sealing-bonding resin, is placed on a board 4, and a semiconductor chip 2 is mounted thereon via the underfill 7. A plurality of pads 3, which are an example of device electrodes, are formed on a circuit formation surface, i.e. lower-side surface in the figures, of the semiconductor chip 2, while a plurality of board electrodes 5 are formed on a circuit formation surface (electrode formation surface), i.e. upper-side surface in the figures, of the board 4 so as to correspond to formation positions of those pads 3, respectively. The pads 3 are electrically connected to the board electrodes 5 via bumps 6, which are an example of bump electrodes, respectively and individually. It is noted that the bumps 6, which are formed mainly of Au, are interposed between the board electrodes 5 and the pads 3 in a slightly-crushed, deformed state. Also, the underfill 7, which is formed of an insulative resin material, is interposed between the semiconductor chip 2 and the board 4 for their bonding so as to fully cover and seal the mutually electrically connected pads 3 and board electrodes 5, as well as the bumps 6, and to maintain the connected state of those members. In such a state, the semiconductor chip 2 is mounted on the board 4, by which the semiconductor chip mounted structure 1, i.e. a semiconductor package component, is made up.

Also, while the semiconductor chip 2 has a generally rectangular shape in a plan view, a recess portion (or groove portion) 8 is formed at a position P1 on the board 4 facing rectangular-periphery end portions of the semiconductor chip 2, i.e., at a peripheral end position P1 of a mounting area over which the semiconductor chip 2 is mounted on the board 4 (an area over which the semiconductor chip 2 is projected onto the board surface, or an opposing area of the board 4 and the semiconductor chip 2), the recess portion 8 being made so as to be dug one step lower than its surrounding surface. This recess portion 8 is so formed that the peripheral end position P1 facing a peripheral end portion of the semiconductor chip 2 is positioned more inward than the recess portion 8. That is, as shown in FIG. 1, the formation position of the recess portion 8 is so determined that the position P1 facing the peripheral end portion of the semiconductor chip 2 is positioned between an outward end (outer end) position P3 and an inward end (inner end) position P2 of the recess portion 8 by referencing a center of the semiconductor chip 2.

Also as shown in FIG. 1, within the recess portion 8, the resin in the fillet portion (foot spreading portion) 7a formed on an outer peripheral side of the underfill 7 is partly placed inside the recess portion 8. However, the resin is not fully filled within the recess portion 8, but only partly placed inside the recess portion 8. Since part of the resin for the fillet portion 7a is placed within the recess portion 8 as shown above, the spreading area of the fillet portion 7a is restricted toward area-reducing directions as compared with cases in which the recess portion 8 is not formed, while an inclination angle of the fillet portion 7a is made to rise more sharply, i.e., its angle relative to the surface of the board 4 is made larger.

The board 4 is formed from, for example, glass epoxy resin material, while the pads 3 and the board electrodes 5 are formed from copper. In addition, the pads 3 and the board electrodes 5 may also be formed from Ni or Au plating or Al. The underfill 7 is formed from an insulative resin material, for example, an epoxy resin material having thermosetting property. As the board 4, others are also usable such as ceramic boards, resin boards, resin sheet boards or the like. The underfill 7 is formed by setting a sheet-like underfill on the board 4, but instead of this, the underfill 7 may also be formed by setting a semi-liquid state resin material on the board 4 by coating or the like.

The recess portion 8 is formed by means of, for example, laser beam machining or the like. With use of such laser beam machining, as shown in FIG. 1, a stop layer for stopping laser beam machining, if provided preparatorily inside the board 4, allows the recess portion 8 of a desired depth to be formed more easily. Such a stop layer 9 may be a copper layer. In addition, with a resin molded board used as the board 4, the recess portion 8 is formed not by laser beam machining but by molding. Such a formation method for the recess portion 8 is preferably determined in consideration of the type of a material used for the board 4, the configuration of the board, and the like.

In the semiconductor chip mounted structure 1 as shown above, for example, the semiconductor chip 2 has a thickness of 0.15 mm, the underfill 7 has a thickness (distance between board and semiconductor chip) of 0.05 mm, the board 4 has a thickness of 0.30 mm, and the recess portion 8 has a depth of 0.10 mm. Also, the recess portion 8 has a width (distance between P2 and P3 in FIG. 1) of 0.45 mm, a distance between the inward end position P2 of the recess portion 8 and the peripheral end position P1 of the semiconductor chip 2 is 0.15 mm, and a distance between the outward end position P3 of the recess portion 8 and the peripheral end position P1 of the semiconductor chip 2 is 0.3 mm. As to the outward end position P3 of the recess portion 8, its being too far from the peripheral end position P1 of the semiconductor chip 2 is not preferable, and the recess portion 8 is preferably formed so that, for example, the distance between P1 and P3 becomes not more than 0.5 mm. Also, the recess portion 8 is preferably formed so that the inward end position P2 of the recess portion 8 does not reach the formation positions of the board electrodes 5.

Figure 2:
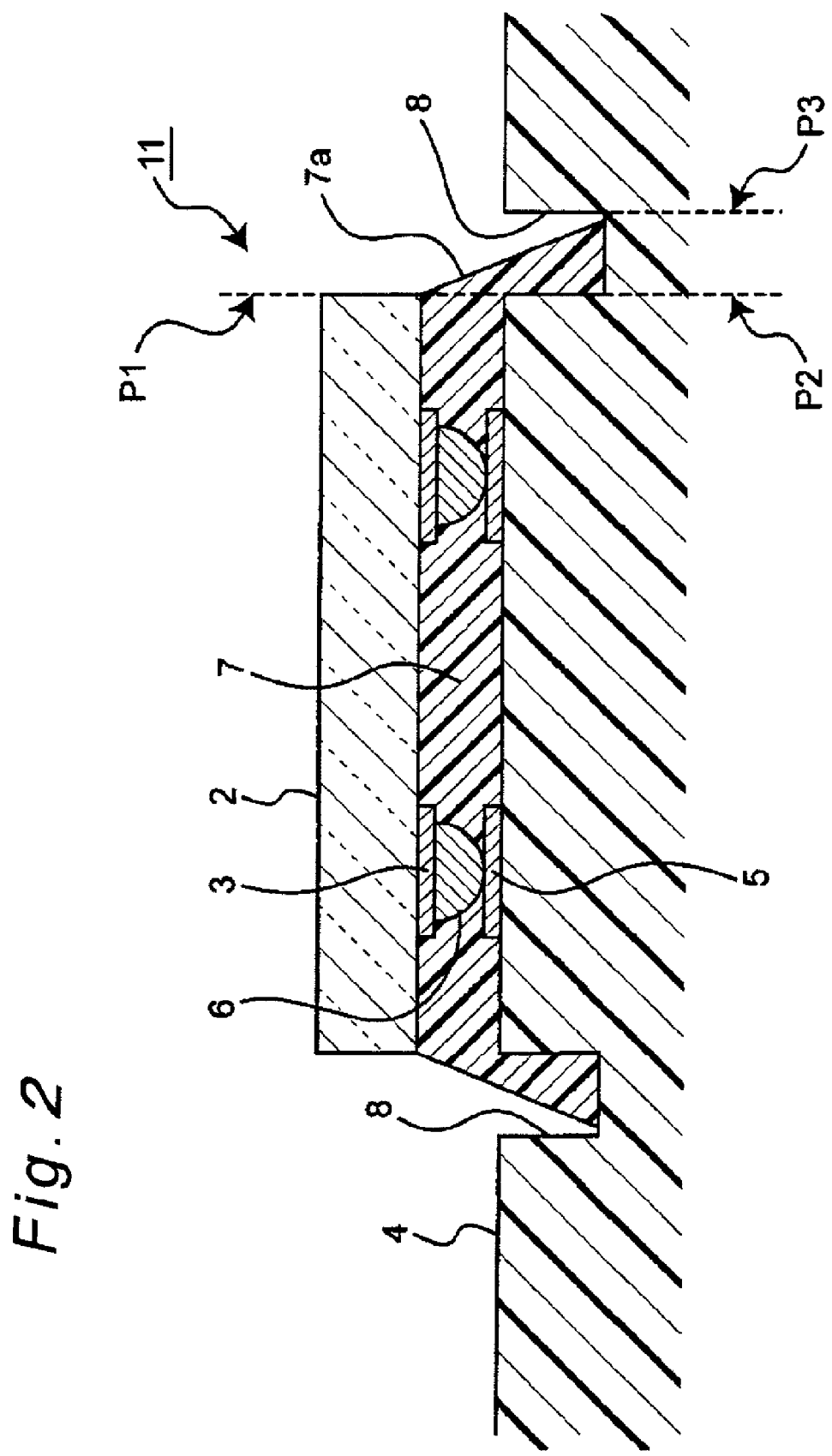
FIG. 2 is a schematic sectional view of a semiconductor chip mounted structure according to a modification of the first embodiment.
Figure 3:
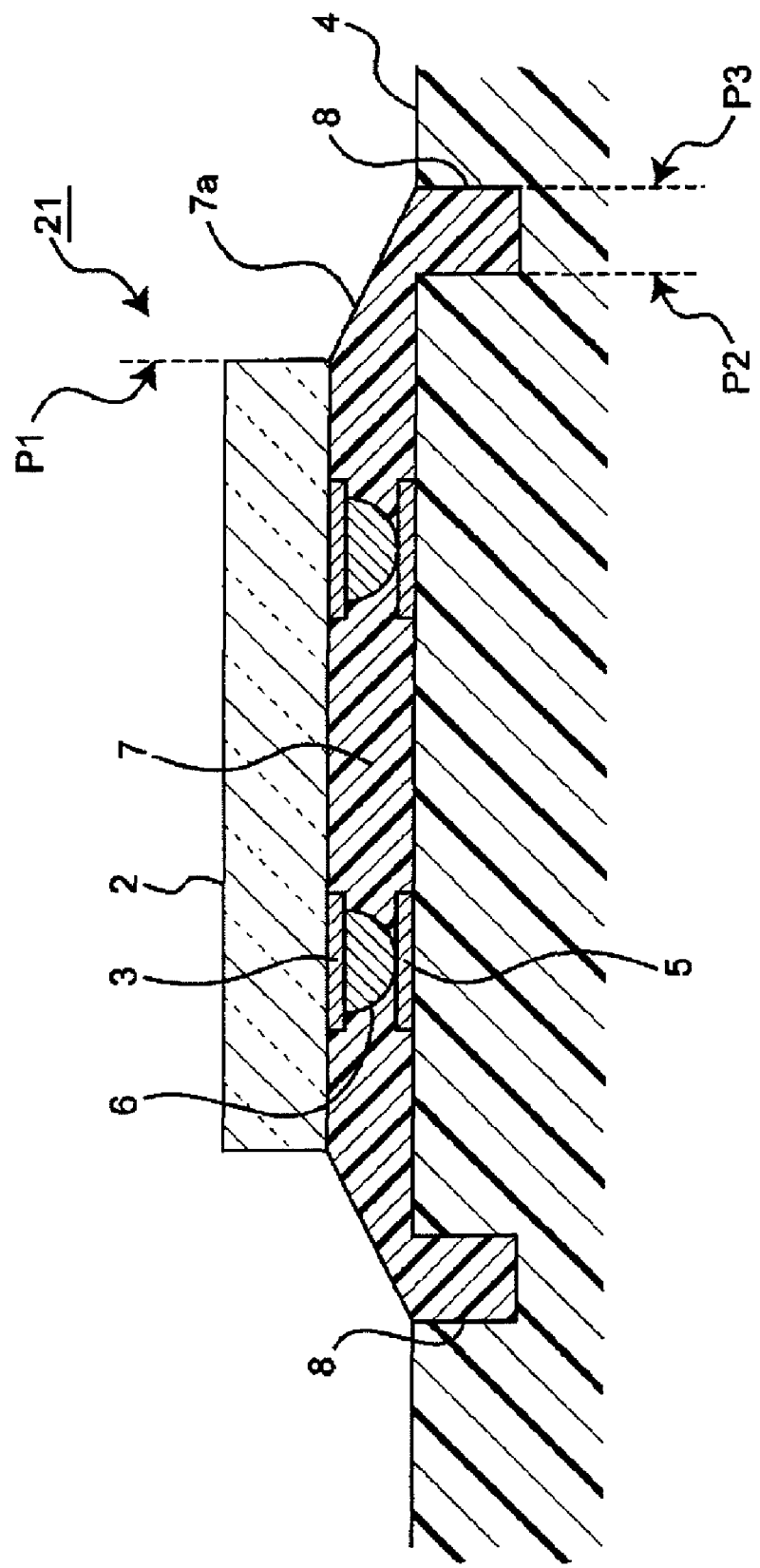
FIG. 3 is a schematic sectional view of a semiconductor chip mounted structure according to a comparative example for the first embodiment.

Now a schematic sectional view of a semiconductor chip mounted structure 11 according to a modification of the first embodiment is shown in FIG. 2, and a schematic sectional view of a semiconductor chip mounted structure 21 according to a comparative example for the first embodiment is shown in FIG. 3. It is noted that the same component members of the semiconductor chip mounted structures 11, 21 of FIGS. 2 and 3 as in the mounted structure 1 of FIG. 1 are designated by the same reference signs and their description is omitted.

First, in the semiconductor chip mounted structure 11 according to the modification shown in FIG. 2, the recess portion 8 is so formed that the inward end position P2 of the recess portion 8 becomes generally coincident with the peripheral end position P1 of the semiconductor chip 2. The inside of the recess portion 8 is similar in structure to that of the mounted structure 1 of FIG. 1 in that the underfill 7 is not fully filled therein, but only partly placed inside the recess portion 8. With such a structure, the spreading area of the fillet portion 7a tends to be slightly increased as compared with the mounted structure 1 of FIG. 1, but there is produced an effect that the spreading area can be restricted as compared with cases in which the recess portion 8 is not formed, so that the spreading area can be restricted in area-reducing directions, allowing the inclination angle of the fillet portion 7a to be made to rise more sharply.

On the other hand, in the semiconductor chip mounted structure 21 according to the comparative example of FIG. 3, the structure is such that the recess portion 8 is formed so as to be outwardly distant from the peripheral end position P1 of the semiconductor chip 2. Further, the inside of the recess portion 8 is generally fully filled with the underfill 7. With the semiconductor chip mounted structure 21 of such a structure, increases of the spreading area of the fillet portion 7a cannot be restricted. That is, increases of the spreading area can be restricted only once the increasingly spreading fillet portion 7a reaches the recess portion 8, whereas increases of the spreading area cannot be restricted with such a structure that the recess portion 8 is formed so as to be largely distant from the peripheral end position of the semiconductor chip 2. As a result, the fillet portion 7a becomes smaller in its inclination angle so as to be formed in a rather laid-down state.

The semiconductor chip mounted structures 1, 11 of the first embodiment in FIGS. 1 and 2, as well as the semiconductor chip mounted structure 21 of the comparative example in FIG. 3 were fabricated and subjected to a thermal cycle test under specified conditions. In more detail, 100 units each of the individual mounted structures were fabricated, and these 100 units of mounted structures were subjected to repeated 500-time cycles of temperature changes from 0° C. to 80° C. in an atmosphere having a relative humidity of 80% or lower. Thereafter, the individual mounted structures were checked for electrical connection state as well as conductibility, by which failure occurrence counts of the semiconductor chip mounted structures due to peeling and internal breakdown by the application of thermal cycles were measured. Also, such thermal cycle tests were executed in a plurality of sets.

As a result of this, the semiconductor chip mounted structures 1 according to the first embodiment of FIG. 1 showed a failure occurrence count of about 0 to 1 unit for 100 units. The semiconductor chip mounted structures 11 according to the first embodiment of FIG. 2 showed a failure occurrence count of about 1 to 2 units for 100 units. In contrast to this, the semiconductor chip mounted structures 21 according to the comparative example of FIG. 3 showed as large a failure occurrence count as 10 to 20 units for 100 units. From these test results, it can be understood that the semiconductor chip mounted structures of the first embodiment are capable of reducing the failure occurrence count enough as compared with the comparative example.

With the semiconductor chip mounted structures 1, 11 of the first embodiment in FIGS. 1 and 2, since the recess portion 8 is formed so as to be positioned at the peripheral end position P1 of the semiconductor chip 2, the amount of resin in the fillet portion 7a, i.e., the amount of resin in the fillet portion 7a placed on the board 4 can be lessened. Accordingly, stress loads due to differences in coefficient of thermal expansion can be reduced, so that the failure occurrence count can be reduced even when thermal cycles are repeatedly applied.

In contrast to this, with the semiconductor chip mounted structure 21 of the comparative example of FIG. 3, since the formation position of the recess portion 8 is largely distant from the peripheral end portion of the semiconductor chip 2, the resulting resin amount in the fillet portion 7a is increased. Accordingly, stress loads cannot be reduced, so that failures are more likely to occur when thermal cycles are repeatedly applied.

As shown above, with the semiconductor chip mounted structures of the first embodiment, since the recess portion is formed at a position corresponding to a peripheral end portion of the semiconductor chip 2, resin that would otherwise spread in the fillet portion 7a is led into the recess portion, so that the spreading area can be reduced. From such a point of view, it is preferable that the resin is not completely filled into the recess portion, in which case the resin amount of the fillet portion can be made smaller. Also, it is preferable that the inclination angle of the fillet portion is larger, in which case the resin amount can be made smaller. From such a point of view, it can be said to be preferable that the inward end position P2 of the recess portion 8 is set more inward than the peripheral end position P1 of the semiconductor chip 2. As a result, stress loads occurring to the individual members due to thermal expansion differences and the like can be reduced. Particularly such an effect is effective for semiconductor chip mounted structures in which a low-k material is used. In addition, from such a function of the recess portion 8, the recess portion 8 can be referred to as a resin-spreading-area restricting recess portion.

Next, a manufacturing method for the semiconductor chip mounted structure 1 as described above, i.e. a method of mounting the semiconductor chip 2 onto the board 4, is explained below by using the schematic sectional views of the semiconductor chip 2 and the board 4 shown in FIGS. 4 and 5.

Figure 4:
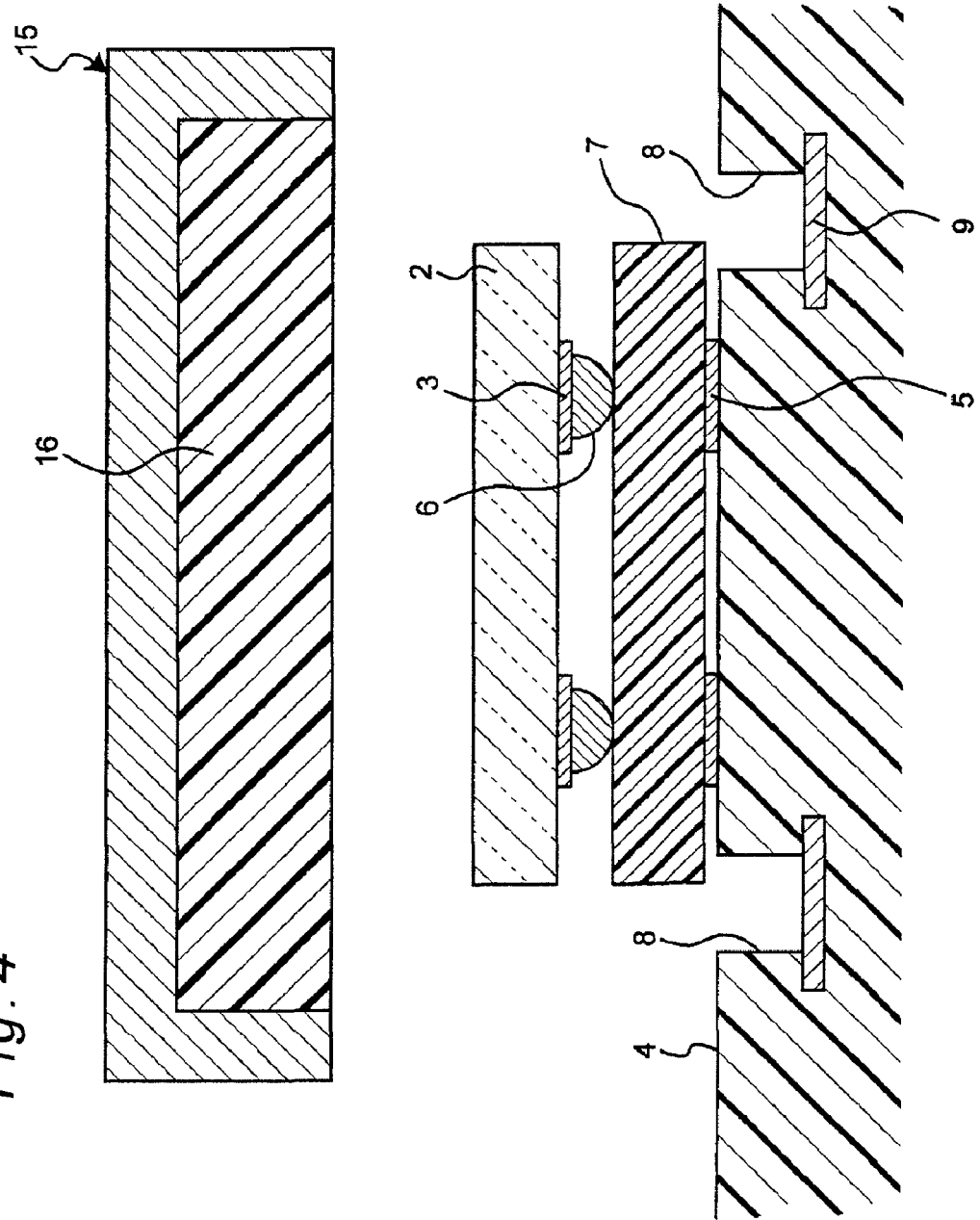
FIG. 4 is a schematic explanatory view of a manufacturing method for the semiconductor chip mounted structure of FIG. 1, showing a state immediately before execution of pressing by a pressure bonding tool.

First, as shown in FIG. 4, a sheet-like underfill 7 as an example is set in a mounting area surrounded by the recess portion 8 in the board 4. In doing this, the underfill 7 is set in place so as to be prevented from entering into the recess portion 8. In addition, instead of use of such a sheet-like underfill 7, a semi-liquid state resin material may be set in place. Thereafter, in a state that the semiconductor chip 2 has been positioned relative to the board 4 so that board electrodes 5 formed in the mounting area of the board 4 are opposed to pads 3, respectively, the semiconductor chip 2 is placed on the board 4 with the underfill 7 interposed therebetween.

Next, a pressure bonding tool 15 equipped with a presser portion 16 formed from a silicone rubber material as an example of elastic material is positioned and set above the semiconductor chip 2 placed on the board 4 with the underfill 7 interposed therebetween. Thereafter, the pressure bonding tool 15 is lowered so as to place the presser portion 16 into contact with a top face of the semiconductor chip 2, and further lowered to press the semiconductor chip 2 against the board 4.

Figure 5:
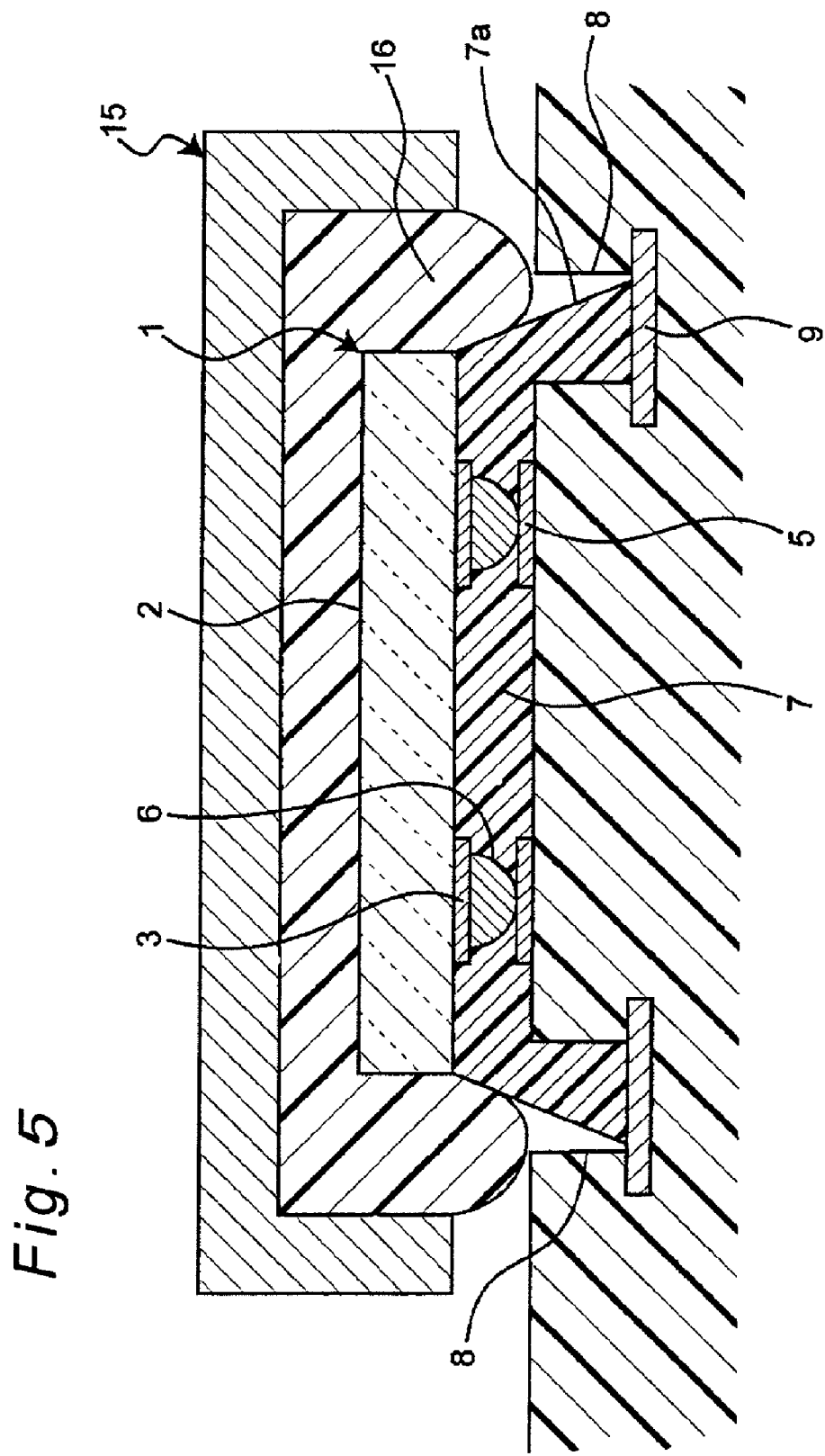
FIG. 5 is a schematic sectional view of the manufacturing method for the semiconductor chip mounted structure of FIG. 1, showing a state under execution of pressing by the pressure bonding tool.

With pressurizing force applied by this pressing operation, as shown in FIG. 5, the underfill 7 is pushed and spread along the surface of the board 4 so as to be spread outward of the mounting area. Since the recess portion 8 is formed around the mounting area, the pushed and spread underfill 7 is partly led to the recess portion 8, by which an area spreading out of the mounting area is restricted by the recess portion 8. Further, the presser portion 16 provided in the pressure bonding tool 15 is formed from a silicone rubber material. Therefore, the presser portion 16, which is elastically deformed in shape along with the pressing operation, acts to restrict the underfill 7 that goes on from around the semiconductor chip 2 and tends to spread outward of the mounting area, while actively leading part of the underfill 7 into the recess portion 8. As a result, a fillet portion 7a having a large inclination angle is formed around the underfill 7.

Meanwhile, by such a pressing operation, the bumps 6 formed in the semiconductor chip 2 are electrically connected to the board electrodes 5 of the board 4 so as to push the underfill 7 aside. After that, the underfill 7 is heated by the pressure bonding tool 15, thereby being thermally set, by which such a semiconductor chip mounted structure 1 as shown in FIG. 1 is formed.

In the above description of the manufacturing method, the pressure bonding tool 15 having the presser portion 16 formed from an elastic material is used to make up the shape of the fillet portion 7a with more reliability. However, such a pressure bonding tool does not necessarily need to be used. Nevertheless, with the use of the pressure bonding tool 15 having the presser portion 16, for example, even in the event of variations in the resin spreading amount due to a planar position of the peripheral end portion of the semiconductor chip 2, the resin spreading amount can be actively restricted by the elastically deformed presser portion 16 so that variations of resin spread can be reduced.

Second Embodiment

Figure 6:
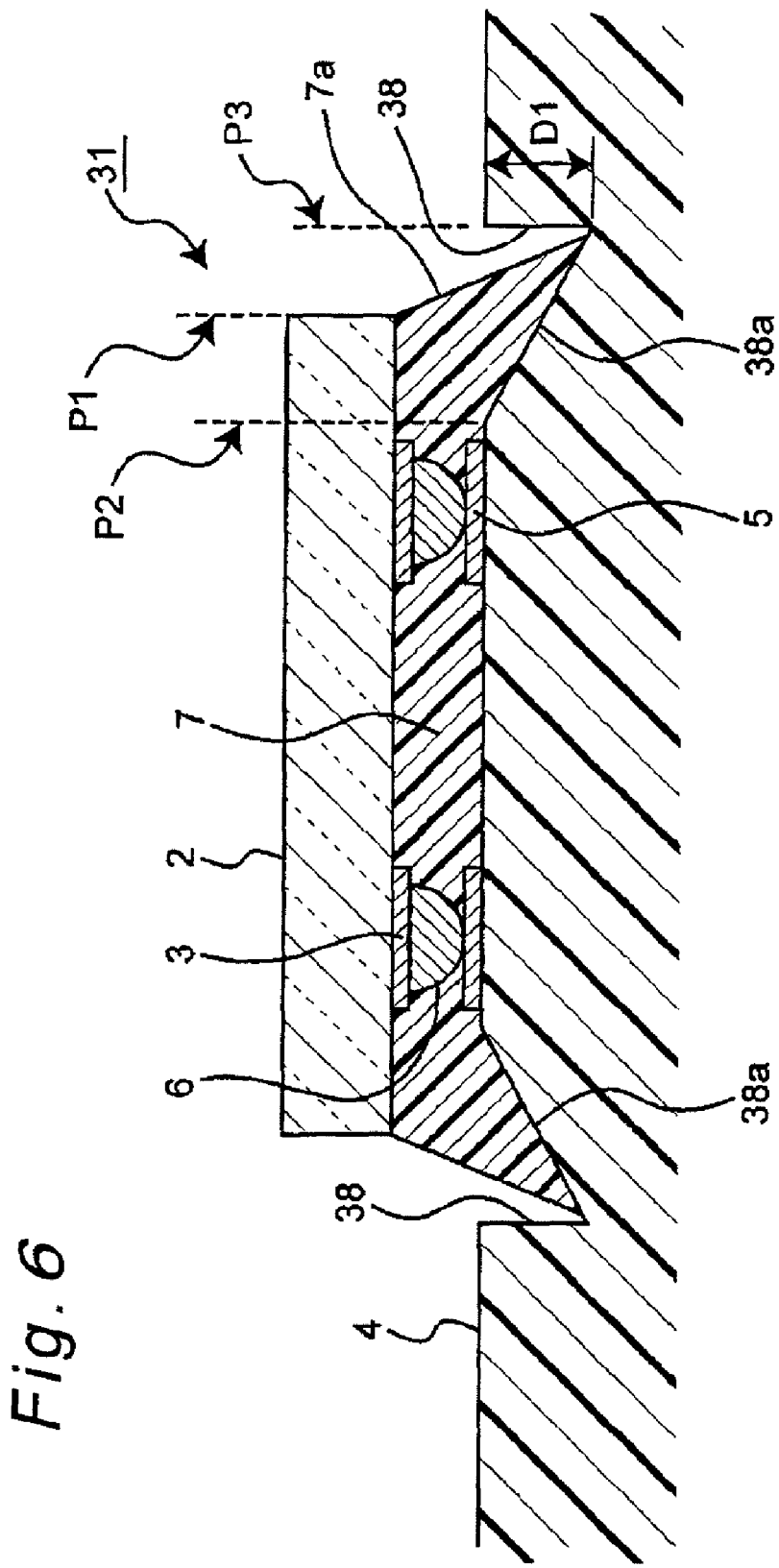
FIG. 6 is a schematic sectional view of a semiconductor chip mounted structure according to a second embodiment of the invention.

The present invention is not limited to the above-described embodiment and may be embodied in other various modes. As an example, FIG. 6 shows a schematic sectional view of a semiconductor chip mounted structure 31 which is an example of a semiconductor device mounted structure according to a second embodiment of the invention. It is noted that the same component members of the semiconductor chip mounted structures 31 of FIG. 6 as in the mounted structure 1 of the first embodiment are designated by the same reference signs and their description is omitted.

As shown in FIG. 6, the semiconductor chip mounted structure 31 of this second embodiment differs from the semiconductor chip mounted structure 1 of the first embodiment in that an inner bottom portion 38a of its recess portion 38 is formed as an inclined surface. Hereinbelow, this difference will be described mainly.

As shown in FIG. 6, a recess portion 38 is formed at a position P1 in the board 4 facing a peripheral end portion of the semiconductor chip 2. The recess portion 38 has an inner bottom portion 38a which is inclined so as to deepen from an inward end position P2 toward an outward direction. This inner bottom portion 38a is so formed as to reach the deepest portion at an outward end position P3. Also, the inward end position P2 of the recess portion 38 is located closer to a center of the semiconductor chip 2 than the peripheral end position P1 of the semiconductor chip 2, and the outward end position P3 is located outer than the outward end position P3 of the semiconductor chip 2, hence a placement configuration similar to that of the semiconductor chip mounted structure 1 of the first embodiment.

In the semiconductor chip mounted structure 31 having such a configuration as described above, as a further effect in addition to the effects of the semiconductor chip mounted structure of the first embodiment, the underfill 7 that goes spreading around the mounting area in mounting of the semiconductor chip 2 onto the board 4 can be smoothly led into the recess portion 38 by the inclined inner bottom portion 38a, making it possible to improve the fluidity of resin. With this improved fluidity of resin, for example, it becomes possible to improve the dischargeability of voids (air bubbles) caused by heating of the underfill 7 out of the resin, so that the reliability of bonding can be enhanced. Also, by the resin being smoothly led into the recess portion 38 along the inclined inner bottom portion 38a, for example, it becomes possible to lessen occurrences of distortions or the like because the direction of resin flow is not largely changed as compared with cases in which the inclined inner bottom portion is not formed as in the configuration of the first embodiment.

Figure 7:
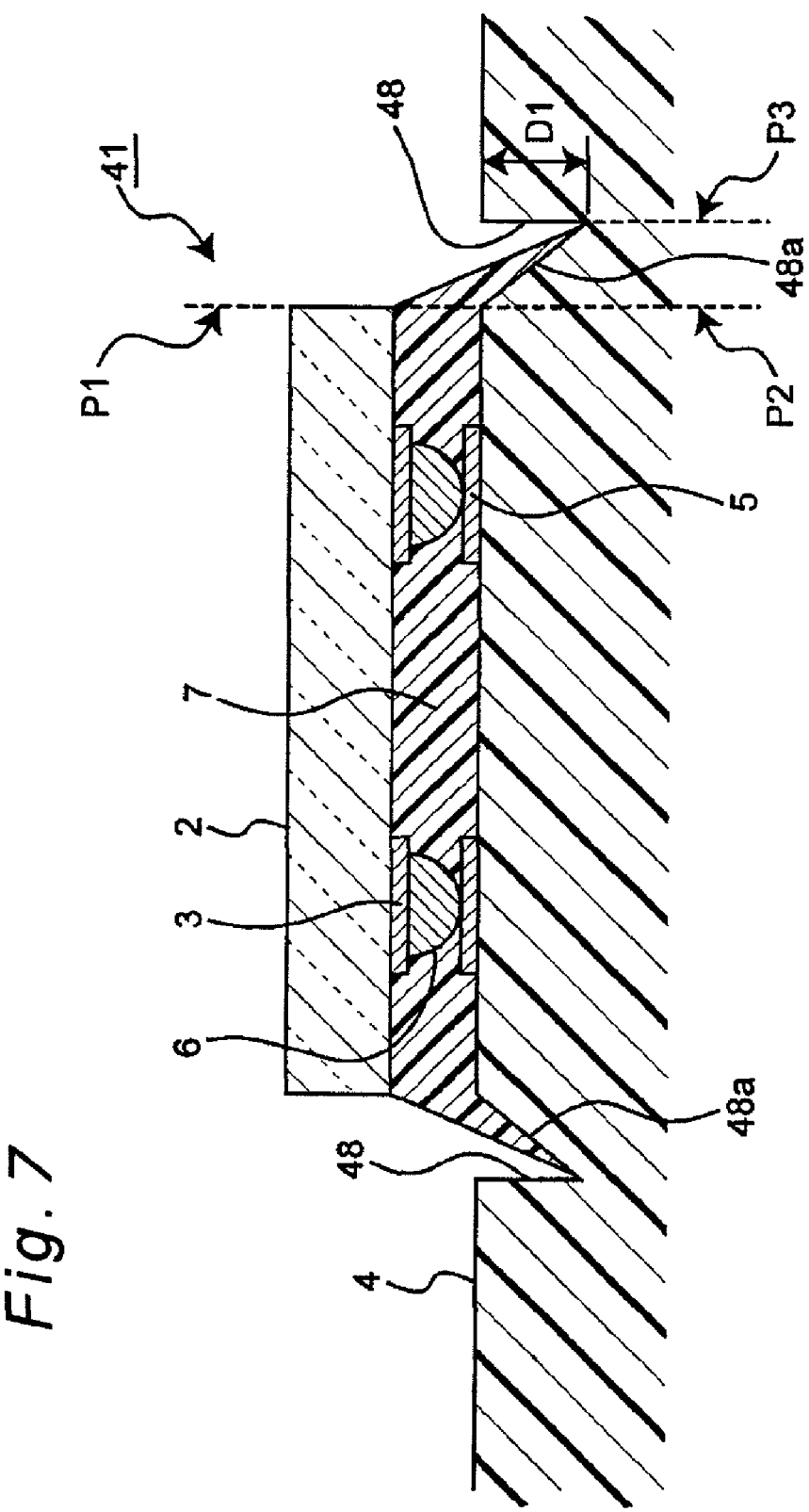
FIG. 7 is a schematic sectional view of a semiconductor chip mounted structure according to a modification of the second embodiment.
Figure 8:
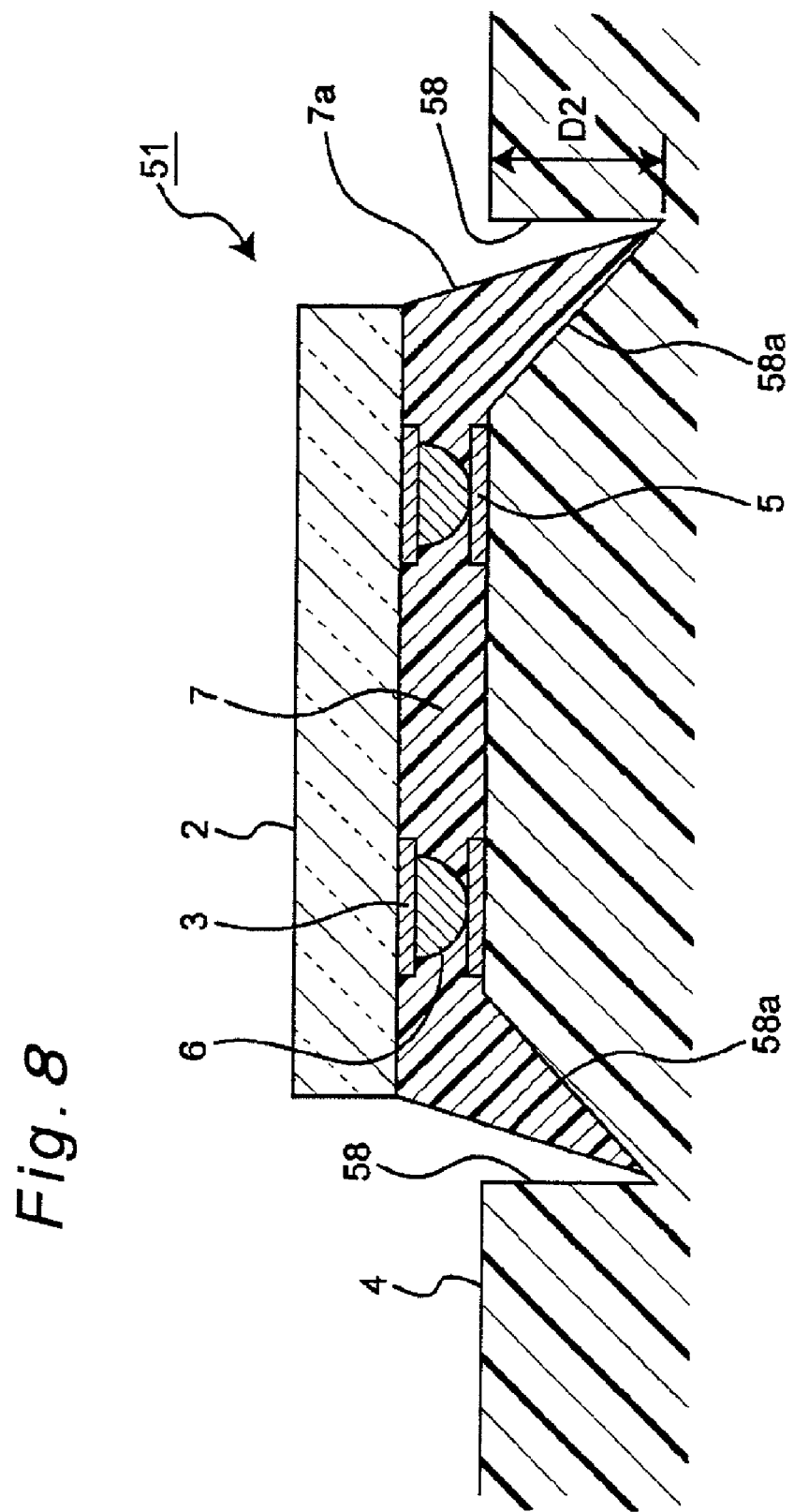
FIG. 8 is a schematic sectional view of a semiconductor chip mounted structure according to a comparative example for the second embodiment.
Figure 9:
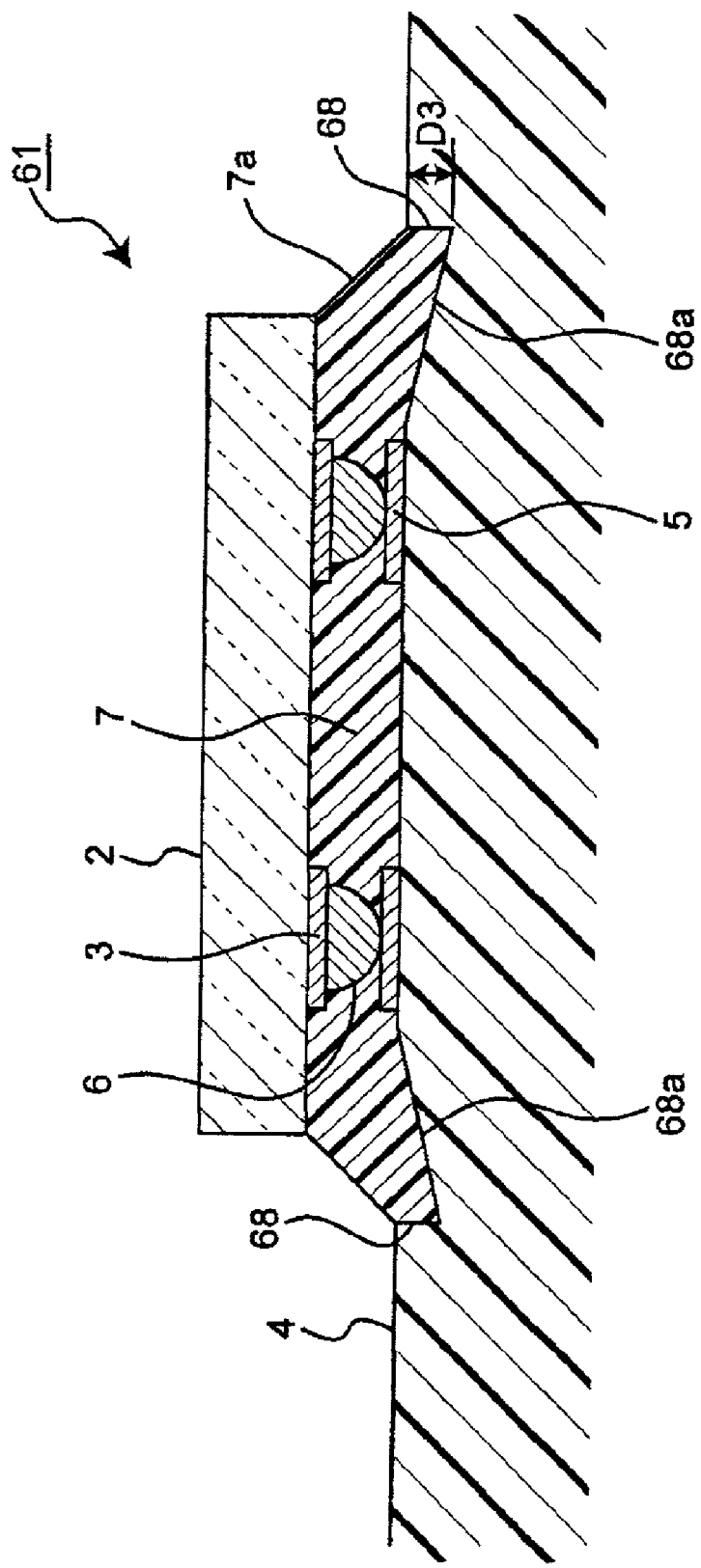
FIG. 9 is a schematic sectional view of a semiconductor chip mounted structure according to another comparative example for the second embodiment.

Now a semiconductor chip mounted structure 41 according to a modification of the second embodiment is shown in a schematic sectional view of FIG. 7, and semiconductor chip mounted structures 51, 61 according to comparative examples are shown in schematic sectional views of FIGS. 8 and 9.

First, the semiconductor chip mounted structure 41 according to the modification of FIG. 7, in which a recess portion 48 having an inclined inner bottom portion 48a at the same depth D1 as the recess portion 38 of FIG. 6 is formed, yet differs in configuration from the mounted structure 31 of FIG. 6 in that the recess portion 48 is so placed that the inward end position P2 of the recess portion 48 becomes generally coincident with the peripheral end position P1 of the semiconductor chip 2.

With such a configuration, loads occurring due to differences in coefficient of thermal expansion can be reduced at the fillet portion 7a, as in the mounted structure 31 of FIG. 6. However, because of a smaller capacity of the recess portion 48 in comparison to the recess portion 38, it is preferable to keep the spreading amount of the underfill 7 from becoming excessively large.

Next, a semiconductor chip mounted structure 51 according to a comparative example of FIG. 8, and a semiconductor chip mounted structure 61 according to a comparative example of FIG. 9, are so modified that the recess portion is of the same placement position as in the mounted structure 31 of FIG. 6 but made deeper or shallower in depth.

More specifically, in the mounted structure 51 of FIG. 8, a depth D2 of a recess portion 58 is set deeper than the depth D1 of the recess portion 38 (e.g., D2=D1×2). With such a configuration, although varying depending on the size of the depth D2 or the amount of resin, the capacity of the recess portion 58 becomes too large, so that thermal expansion or thermal contraction of the underfill 7 placed within the recess portion 58 can cause stress loads that affect the semiconductor chip 2. Also, in the mounted structure 61 of FIG. 9, a depth D3 of a recess portion 68 is set shallower than the depth D1 of the recess portion 38 (e.g., D3=D1×0.5). With such a configuration, although varying depending on the size of the depth D3 or the amount of resin, the capacity of the recess portion 68 is insufficient to lead the spreading resin, making it difficult in some cases to effectively raise the inclination angle of the fillet portion 7a. In such a case, it may be impossible to sufficiently reduce stress loads caused by differences in coefficient of thermal expansion among the individual members.

The semiconductor chip mounted structures 31, 41, 51 and 61 of FIGS. 6 to 9 were fabricated, and subjected to a thermal cycle test under the same conditions as in the first embodiment. As a result, the semiconductor chip mounted structure 31 according to the second embodiment of FIG. 6 showed a failure occurrence count of 0 units for 100 units. The semiconductor chip mounted structure 41 according to the second embodiment of FIG. 7 showed a failure occurrence count of about 2 to 4 units for 100 units. In contrast to this, the semiconductor chip mounted structure 51 according to the comparative example of FIG. 8 showed as large a failure occurrence count as 10 to 20 units for 100 units. The semiconductor chip mounted structure 61 according to the comparative example of FIG. 9 showed as large a failure occurrence count as 5 to 10 units for 100 units. From these test results, it can be understood that the semiconductor chip mounted structures of the second embodiment are capable of reducing the failure occurrence count enough as compared with the comparative examples.

Third Embodiment

Figure 10:
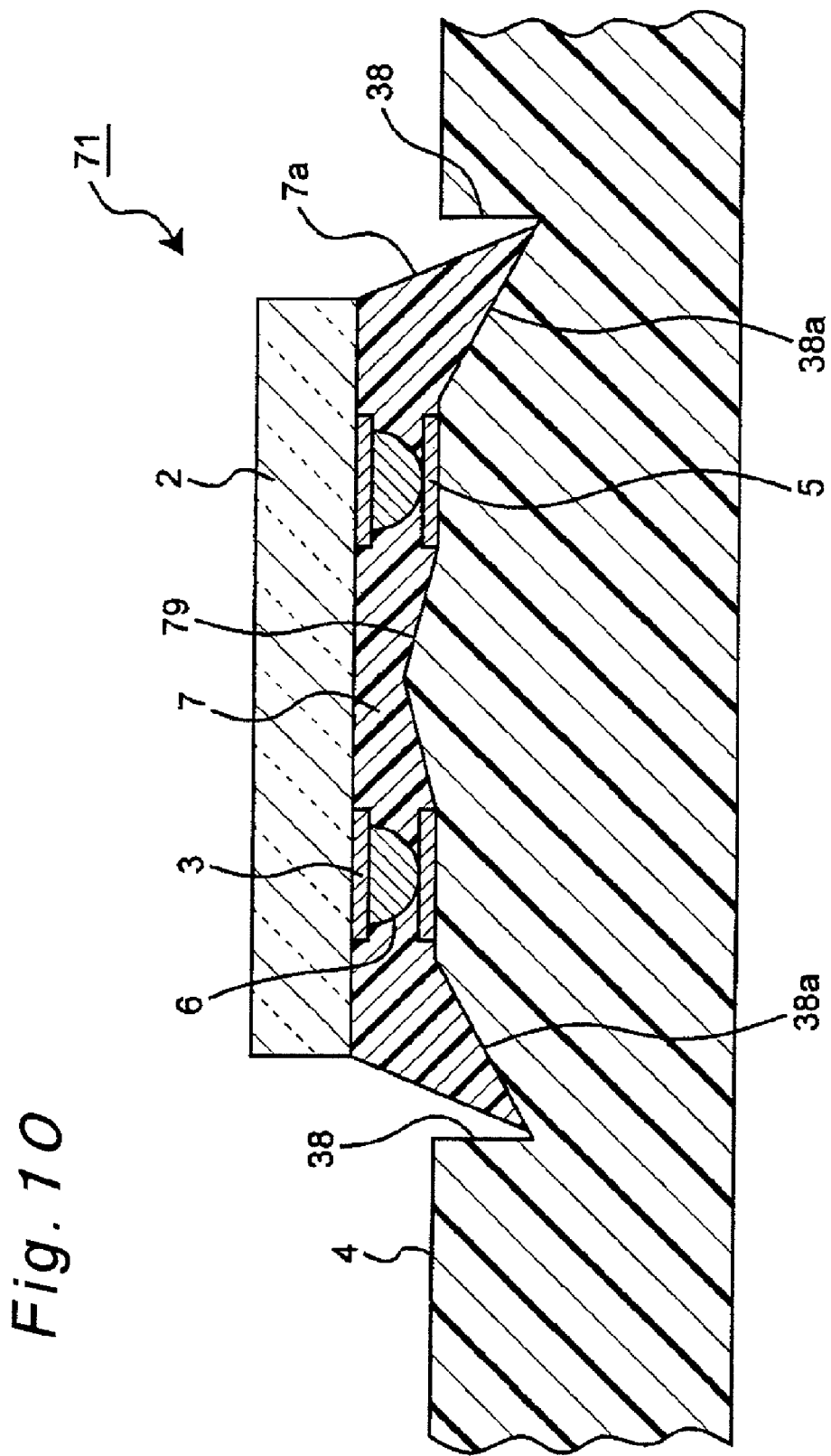
FIG. 10 is a schematic sectional view of a semiconductor chip mounted structure according to a third embodiment of the invention.

Next, FIG. 10 shows a schematic sectional view of a semiconductor chip mounted structure 71 according to a third embodiment of the invention. As shown in FIG. 10, the semiconductor chip mounted structure 71 of the third embodiment, although having the same placement configuration of the recess portion 38 as in the mounted structure 31 of the second embodiment shown in FIG. 6, yet differs from the configuration of FIG. 6 in that a swelling portion 79 swollen from the rest of the surface is formed generally near a center of the mounting area in the board 4.

As shown in FIG. 10, by the swelling portion 79 being formed generally near the center of the mounting area, a gradient is formed over a'range from a top portion of the swelling portion 79 via the inclined inner bottom portion 38a in the recess portion 38 to the deepest portion of the recess portion 38. Such a gradient may be formed, for example, either radially from near the center of the mounting area, or toward four directions. Also, such a gradient does not necessarily need to be continuously formed and may be formed so as to include a flat portion in part, i.e., in a pyramidal shape (or stepwise shape). This is because, for example, it is difficult to form an inclined surface in vicinities of places where the board electrodes 5 are formed.

Thus, since a downward gradient is provided from near the center of the mounting area to inside of the recess portion 38 in the board 4, it becomes possible to improve the fluidity of the underfill 7 that is pushed and spread outward of the mounting area during the mounting operation of the semiconductor chip 2, so that voids or the like can efficiently be discharged, allowing a bond of high reliability to be achieved. With such good fluidity, the resin can be led into the recess portion 38 actively and effectively, making it possible to effectively restrict the spreading area of the fillet portion 7a. In addition, the swelling portion 79 as shown above is formed at a height of about 0.015 to 0.025 mm in comparison to a thickness of 0.05 mm of the underfill 7 in which the swelling portion 79 is not formed.

Fourth Embodiment

Next, as semiconductor chip mounted structures according to a fourth embodiment of the invention, various modes of planar placement configuration of the recess portion are described. Schematic plan views of semiconductor chip mounted structures 101, 111, 121 and 131 according to the fourth embodiment are shown in FIGS. 11 to 14. It is noted that the following description will be made about the planar placement configuration of the recess portion while the sectional configurations of the recess portion according to the first to third embodiments are applied.

Figure 11:
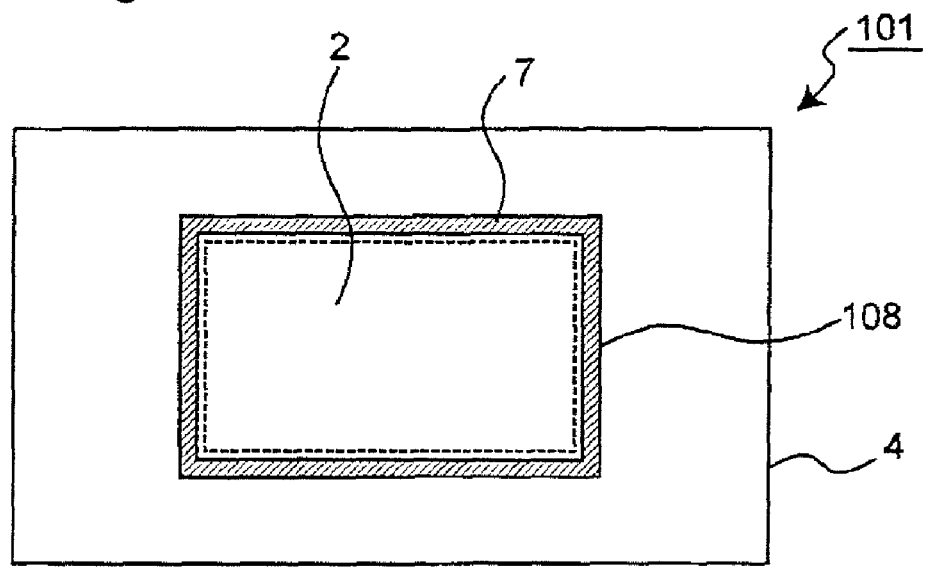
FIG. 11 is a schematic plan view of a semiconductor chip mounted structure according to a fourth embodiment of the invention.

First, in a semiconductor chip mounted structure 101 of FIG. 11, a recess portion 108 is formed over an entire periphery of the semiconductor chip 2 along its outer peripheral end portion. By the recess portion 108 being formed over the entire periphery like this, the underfill 7 that goes spreading from any position of the peripheral end portion is led into the recess portion 108, so that the spreading area can reliably be restricted.

Figure 12:
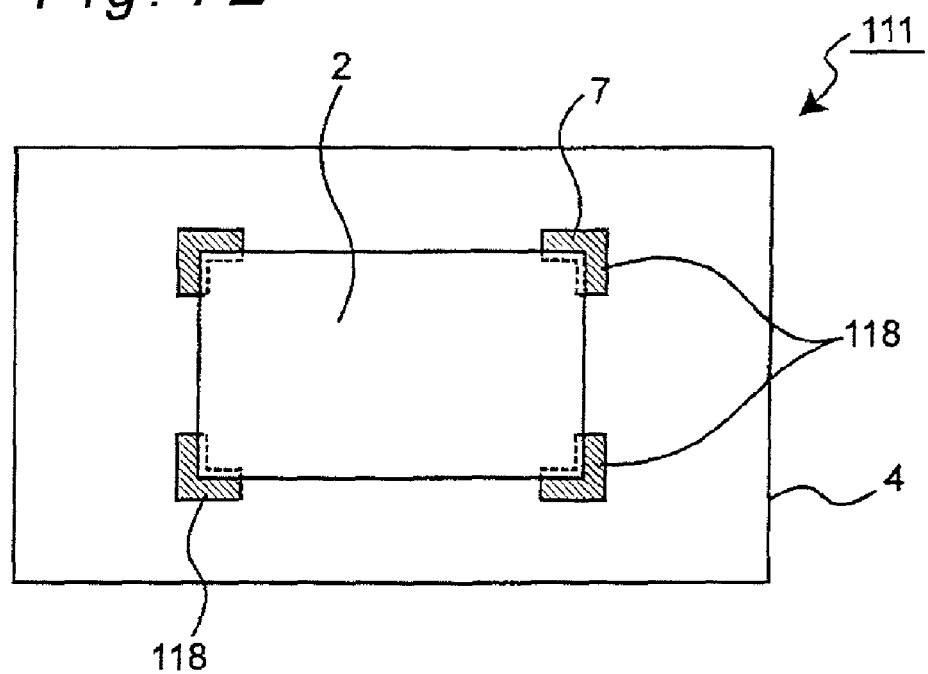
FIG. 12 is a schematic plan view of another semiconductor chip mounted structure according to the fourth embodiment of the invention.

Next, a semiconductor chip mounted structure 111 of FIG. 12 adopts a configuration in which a recess portion 118 is placed at four corner portions and their vicinities of the semiconductor chip 2. Generally, the corner portions of the semiconductor chip 2 are larger in the distance from the center of the semiconductor chip 2, so that stress loads due to thermal expansion and thermal contraction tend to be concentrated. From this point of view, such a configuration is effective for cases where a primary aim is to reduce stress loads at the corner portions.

Figure 13:
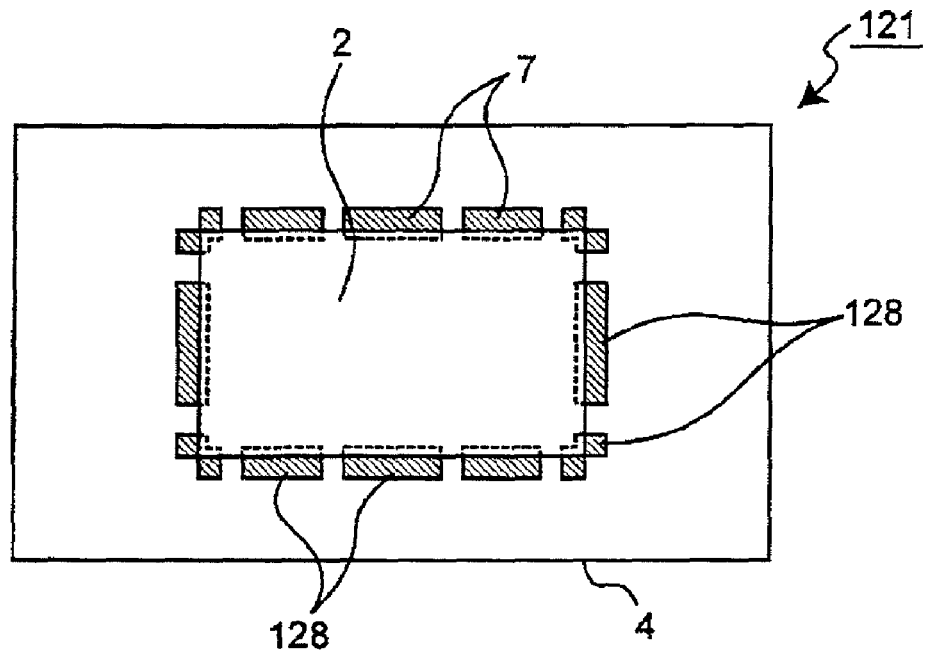
FIG. 13 is a schematic plan view of another semiconductor chip mounted structure according to the fourth embodiment of the invention.

In a semiconductor chip mounted structure 121 of FIG. 13 adopts a configuration that a recess portion 128 is partly formed at a position facing the peripheral end portion of the semiconductor chip 2. That is, in the peripheral end portion, the recess portion 128 is not continuously formed, and portions where the recess portion 128 is not formed are present. With such a configuration, portions of the peripheral end portion where the recess portion 128 is not formed can be utilized as interconnection forming positions, making it possible to facilitate the design of the semiconductor chip mounted structure as a whole. It is noted that the recess portion 128 partly placed as shown above, when provided so as to be centered on the corner portions, makes it possible to reduce stress loads at the corner portions that are more liable to stress concentration, while the recess portion 128, when provided so as to be centered on side portions, makes it possible to actively restrict the resin spreading area at side portions involving larger amounts of resin spread than at the corner portions.

Figure 14:
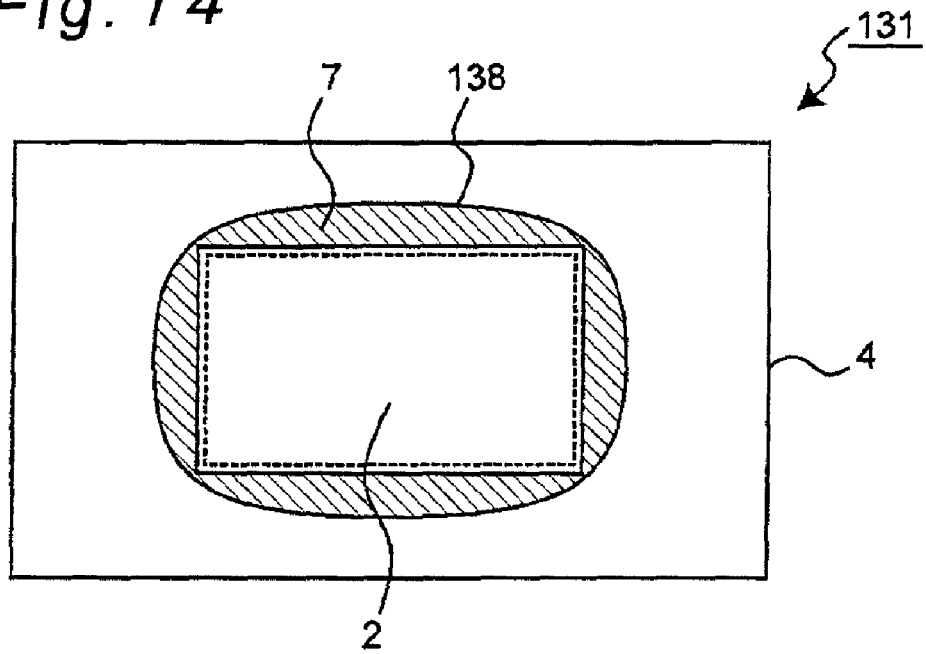
FIG. 14 is a schematic plan view of another semiconductor chip mounted structure according to the fourth embodiment of the invention.

Next, the semiconductor chip mounted structure 131 of FIG. 14 adopts a placement configuration of a recess portion 138 which has a generally elliptical shape so as to include a position facing the peripheral end portion of the semiconductor chip 2. Such a placement configuration of the recess portion 138 is provided by taking into consideration actual fluidity of the underfill 7, in which case the recess portion 138 is set to a larger width at side portions having relatively high fluidity and to a smaller width of the recess portion 138 at corner portions having relatively low fluidity. With such a configuration, the underfill 7 that goes spreading largely at the side portions can be securely restricted in the recess portion 138 having a larger capacity, while the spreading of the underfill 7 can be restricted also at the corner portions where stress concentration is more likely to occur. Further, by using in combination the recess portion 138 having such a configuration as shown above and the pressure bonding tool 15 having the presser portion 16 formed from an elastic material, a generally elliptical-shaped fillet portion 7a can be formed, making it possible to reduce the total stress loads generated due to differences in coefficient of thermal expansion.

Fifth Embodiment

Figure 21:
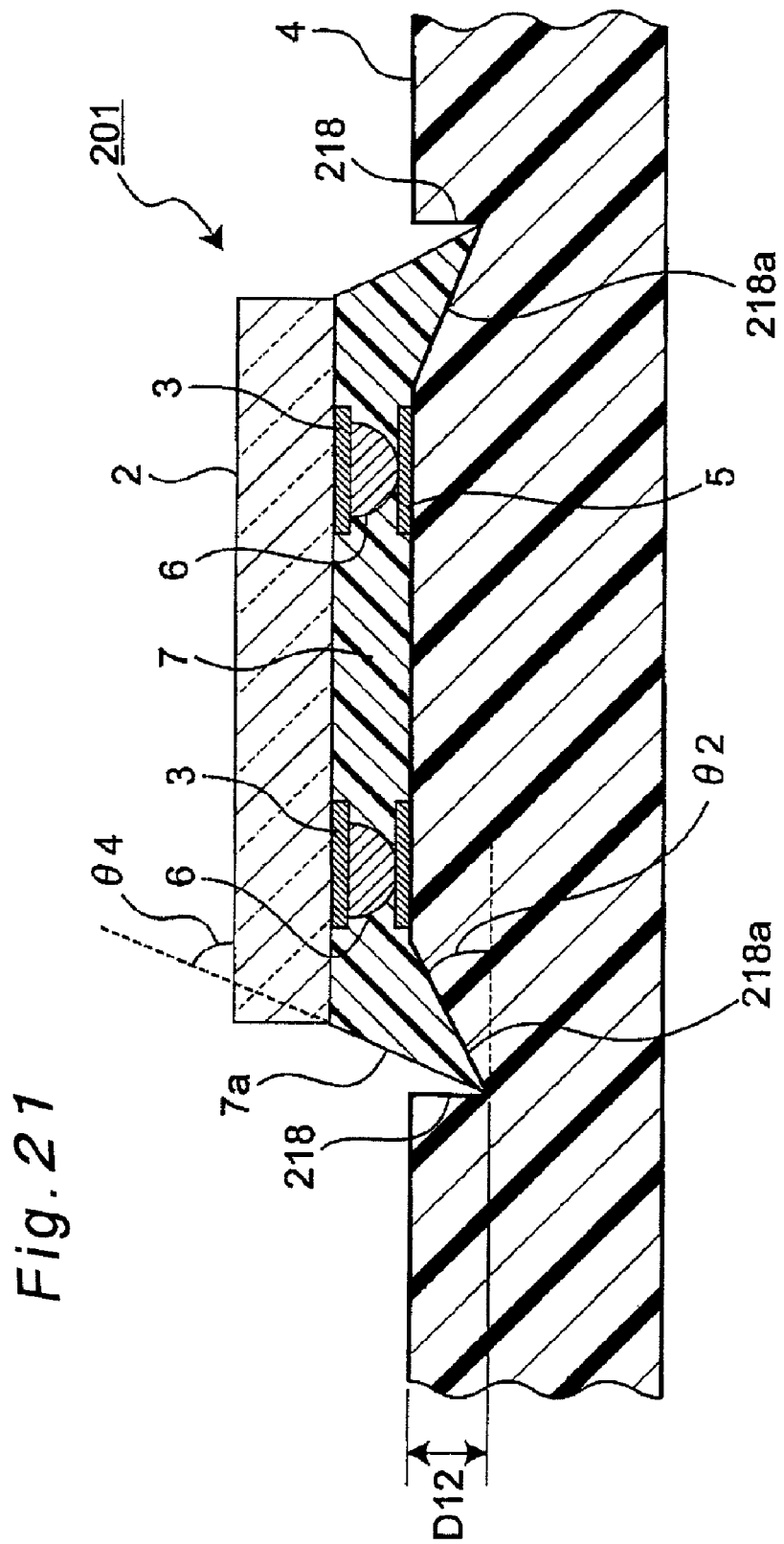
FIG. 21 is a schematic sectional view of the semiconductor chip mounted structure of FIG. 20 taken along the line B-B.

Next, FIG. 20 shows a schematic plan view of a semiconductor chip mounted structure 201 according to a fifth embodiment of the invention. FIG. 21 shows a sectional view of the semiconductor chip mounted structure 201 of FIG. 20 taken along the line B-B, and FIG. 22 shows a sectional view thereof taken along the line C-C.

First, as shown in the schematic plan view of FIG. 20, the semiconductor chip mounted structure 201 adopts a configuration that four recess portions 208 are placed at four corner portions of the semiconductor chip 2 and moreover two recess portions 218 are also placed at side portions between the corner portions.

Figure 22:
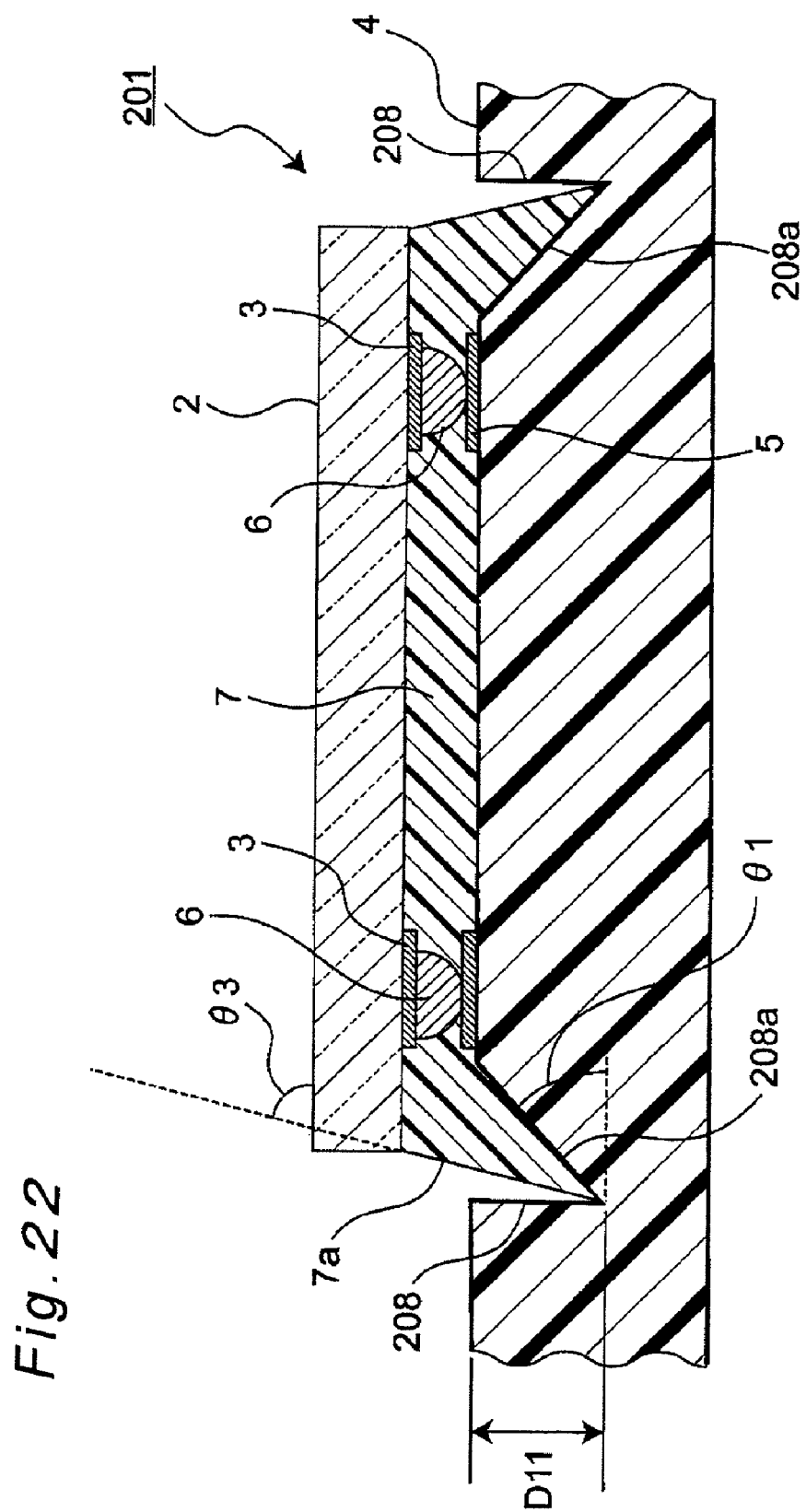
FIG. 22 is a schematic sectional view of the semiconductor chip mounted structure of FIG. 20 taken along the line C-C.

In this case, as shown in FIG. 21, which is a sectional view (B-B cross section) of side portions, and in FIG. 22, which is a sectional view (C-C cross section) of corner portions in the semiconductor chip mounted structure 201, a depth D11 of an inner bottom surface 208a of each of the recess portions 208 formed at the corner portions is deeper than a depth D12 of the inner bottom surface 218a of each of the recess portions 218 formed at the side portions. Since the recess portions 208 and 218 are different in depth from each other as shown above, an inclination angle θ1 of the inner bottom surface 208a of each of the recess portions 208 at the corner portions can be made larger than an inclination angle θ2 of the inner bottom surface 218a of each of the recess portions 218 at the side portions.

In the semiconductor chip mounted structure 201 of the fifth embodiment having the configuration as shown above, in consideration of the actual fluidity of the underfill 7, the inclination angle θ2 of the inner bottom surface 218a of each of the recess portions 218 at the side portions having relatively high fluidity is formed gentler so that the flow quantity of the underfill 7 into the recess portions 218 can be restricted. Moreover, the inclination angle θ1 of the inner bottom surface 208a of each of the recess portions 208 at the corner portions having relatively low fluidity is set larger, so that the flow of the underfill 7 can be easily led to the underfill 7. Thus, a reliable sealing by the underfill 7 can be implemented for the semiconductor chip mounted structure 201 as a whole.

Furthermore, by the setting that the depth D11 of the recess portions 208 at the corner portions is larger than the depth D12 of the recess portions 218 at the side portions, an inclination angle θ3 of the fillet portions 7a formed at the corner portions can be made larger than an inclination angle θ4 of the fillet portions 7a formed at the side portions. By setting a relatively larger inclination angle θ3 of the fillet portions 7a at the corner portions that are liable to occurrence of stress concentration as shown above, stress loads generated due to differences in coefficient of thermal expansion or the like can be reduced.

Although the semiconductor chip mounted structure 201 shown in FIG. 20 has been described for a case where the inner end portion of each of the recess portions 208 at the corner portions is formed along the configuration of the corner portions of the semiconductor chip 2, the invention is not limited to such cases only. Instead, for example, as shown in a schematic plan view of a semiconductor chip mounted structure 251 according to a modification of FIG. 23, it is also allowable to adopt a configuration that the inner bottom surface of a recess portion 258 extends up to an inner region of each corner portion. In particular, since the pads 3 or the like are in many cases not formed in the inner regions of the corner portions, adopting such a configuration as shown above makes it possible to effectively utilize the inner regions.

It is to be noted that, by properly combining the arbitrary embodiments of the aforementioned various embodiments, the effects possessed by them can be produced.

According to the semiconductor chip mounted structure of the present invention, by providing the recess portion for leading thereinto resin that goes spreading from the mounting area to positions of the board surface corresponding to peripheral end portions of the semiconductor chip, it becomes achievable to suppress increases of the resin spreading area, making it possible to relax stress loads that occur to the semiconductor chip due to thermal expansion differences or thermal contraction differences among the individual members caused by heating and cooling processes during a mounting operation as well as due to flexures of the board relative to mechanical loads after the mounting operation, so that internal breakdown of the chip can be avoided.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Application No. 2006-349511 filed on Dec. 26, 2006, including specification, claims, drawings, and summary are incorporated herein by reference in its entirety.

The invention claimed is:

1. A semiconductor device mounted structure comprising:
   a semiconductor device having a plurality of device electrodes;
   a board having a plurality of board electrodes;
   a plurality of bump electrodes for connecting the device electrodes and the board electrodes to each other, respectively;
   a sealing-bonding resin which seals the device electrodes, the board electrodes and the bump electrodes, respectively, and which is placed between the semiconductor device and the board so as to make the semiconductor device and the board bonded to each and other;
   a recess portion which is formed in an electrode formation surface of the board at a position facing a peripheral end portion of the semiconductor device, and in which the sealing-bonding resin is placed partially inside thereof; and
   a stop layer for machining which is exposed in an inner bottom portion of the recess portion;
   wherein the recess portion has the inner bottom portion which is inclined so as to increasingly deepen toward a periphery of the semiconductor-device opposing region of the board.

2. The semiconductor device mounted structure as defined in claim 1, wherein the recess portion formed at a position facing a corner portion of the semiconductor device having a generally rectangular shape is so formed as to have the inner bottom portion having an inclination angle larger than an inclination angle of the inner bottom portion of the recess portion formed at any other position.

3. A semiconductor device mounted structure comprising:
   a semiconductor device having a plurality of device electrodes;
   a board having a plurality of board electrodes;
   a plurality of bump electrodes for connecting the device electrodes and the board electrodes to each other, respectively;
   a sealing-bonding resin which seals the device electrodes, the board electrodes and the bump electrodes, respectively, and which is placed between the semiconductor device and the board so as to make the semiconductor device and the board bonded to each and other;
   a recess portion which is formed in an electrode formation surface of the board at a position facing a peripheral end portion of the semiconductor device, and in which the sealing-bonding resin is placed partially inside thereof; and
   a stop layer for machining which is exposed in an inner bottom portion of the recess portion;
   wherein a swelling portion swollen to above an opening end portion of the recess portion is formed at a center of the semiconductor-device opposing region of the board, and a downward gradient is provided over a range from the swelling portion to the inner bottom portion of the recess portion.

4. A semiconductor device mounted structure comprising:
   a semiconductor device having a plurality of device electrodes;
   a board having a plurality of board electrodes;
   a plurality of bump electrodes for connecting the device electrodes and the board electrodes to each other, respectively;

a sealing-bonding resin which seals the device electrodes, the board electrodes and the bump electrodes, respectively, and which is placed between the semiconductor device and the board so as to make the semiconductor device and the board bonded to each and other;

a recess portion which is formed in an electrode formation surface of the board at a position facing a peripheral end portion of the semiconductor device, and in which the sealing-bonding resin is placed partially inside thereof; and a stop layer for machining which is exposed in an inner bottom portion of the recess portion;

wherein the recess portion formed at a position facing a corner portion of the semiconductor device having a generally rectangular shape is so formed as to be smaller in internal capacity than the recess portion formed at any other position.

5. A semiconductor device mounted structure comprising:

a semiconductor device having a plurality of device electrodes;

a board having a plurality of board electrodes;

a plurality of bump electrodes for connecting the device electrodes and the board electrodes to each other, respectively;

a sealing-bonding resin which seals the device electrodes, the board electrodes and the bump electrodes, respectively, and which is placed between the semiconductor device and the board so as to make the semiconductor device and the board bonded to each and other;

a recess portion which is formed in an electrode formation surface of the board at a position facing a peripheral end portion of the semiconductor device, and in which the sealing-bonding resin is placed partially inside thereof; and a stop layer for machining which is exposed in an inner bottom portion of the recess portion;

wherein the recess portion is formed so as to be continuous over an entire periphery of the peripheral end portion of the semiconductor-device opposing region of the board.

6. A semiconductor device mounting method comprising:

placing a sealing-bonding resin on a mounting area of a board in which a recess portion is formed at a peripheral end portion of the mounting area for a semiconductor device;

pressing the semiconductor device against the board via the sealing-bonding resin so that device electrodes of the semiconductor device and board electrodes of the board are connected to each other via bump electrodes, respectively, while restricting a resin spreading amount by restricting the spreading resin from the periphery of the semiconductor device while restricting a spreading area of the sealing-bonding resin by leading part of the sealing-bonding resin that spreads out of the mounting area into the recess portion so that the sealing bonding resin only partly fills an inside of the recess portion and an inclined plane, that is inclined relative to a surface of the board, is formed on an outer peripheral side of the sealing-bonding resin located between the semiconductor device and the board, and the device electrodes, the board electrodes and the bump electrodes, respectively, are sealed by the sealing-bonding resin; and thereafter, heating and curing the sealing-bonding resin, thereby mounting the semiconductor device onto the board.

7. The semiconductor device mounting method as defined in claim 6, wherein the sealing by the sealing-bonding resin is fulfilled, with use of a pressure bonding tool having a presser portion formed from an elastic material, by pressing the semiconductor device against the board via the sealing-bonding resin with the presser portion, and moreover pressing the sealing-bonding resin spreading out of the mounting area with the presser portion elastically deformed to lead the sealing-bonding resin into the recess portion while the resin sealing-bonding resin spreading area and spreading amount are restricted.

* * * * *